(12) United States Patent
Kim et al.

(10) Patent No.: US 9,172,055 B2
(45) Date of Patent: *Oct. 27, 2015

(54) ORGANIC LIGHT-EMITTING DEVICE INCLUDING MULTI-LAYERED HOLE TRANSPORT LAYER, AND ORGANIC LIGHT-EMITTING DISPLAY APPARATUS INCLUDING THE SAME

(71) Applicants: Hyoung-Kun Kim, Yongin (KR); Sam-Il Kho, Yongin (KR); Mie-Hwa Park, Yongin (KR); Yoon-Hyun Kwak, Yongin (KR); Ja-Hyun Im, Yongin (KR); Chang-Woong Chu, Yongin (KR); Kwan-Hee Lee, Yongin (KR)

(72) Inventors: Hyoung-Kun Kim, Yongin (KR); Sam-Il Kho, Yongin (KR); Mie-Hwa Park, Yongin (KR); Yoon-Hyun Kwak, Yongin (KR); Ja-Hyun Im, Yongin (KR); Chang-Woong Chu, Yongin (KR); Kwan-Hee Lee, Yongin (KR)

(73) Assignee: SAMSUNG DISPLAY CO., LTD., Yongin, Gyunggi-Do (KR)

( * ) Notice: Subject to any disclaimer, the term of this patent is extended or adjusted under 35 U.S.C. 154(b) by 415 days.

This patent is subject to a terminal disclaimer.

(21) Appl. No.: 13/682,076

(22) Filed: Nov. 20, 2012

(65) Prior Publication Data
US 2014/0001444 A1    Jan. 2, 2014

(30) Foreign Application Priority Data
Jun. 27, 2012 (KR) .......................... 10-2012-0069476

(51) Int. Cl.
*H01L 51/50* (2006.01)
*H01L 27/32* (2006.01)
*H01L 51/00* (2006.01)

(52) U.S. Cl.
CPC ........ *H01L 51/5064* (2013.01); *H01L 27/3225* (2013.01); *H01L 51/5092* (2013.01); *H01L 51/006* (2013.01); *H01L 51/0061* (2013.01); *H01L 51/506* (2013.01); *H01L 51/5072* (2013.01); *H01L 2251/308* (2013.01)

(58) Field of Classification Search
CPC ............ H01L 27/3225; H01L 51/5064; H01L 51/5072; H01L 51/5092; H01L 51/54; C09K 11/06
See application file for complete search history.

(56) References Cited

U.S. PATENT DOCUMENTS

| | | | |
|---|---|---|---|
| 2005/0221124 A1 | 10/2005 | Hwang et al. | |
| 2009/0294778 A1* | 12/2009 | Mitsuya | 257/79 |
| 2010/0244008 A1 | 9/2010 | Lee et al. | |
| 2011/0193074 A1 | 8/2011 | Lee et al. | |
| 2012/0214993 A1* | 8/2012 | Aihara et al. | 544/180 |
| 2013/0140530 A1* | 6/2013 | Kho et al. | 257/40 |
| 2013/0153865 A1* | 6/2013 | Kho et al. | 257/40 |

FOREIGN PATENT DOCUMENTS

| | | |
|---|---|---|
| JP | 2011-084553 A | 4/2011 |
| KR | 10-2005-0097670 A | 10/2005 |
| KR | 10-2009-0029008 A | 3/2009 |

(Continued)

*Primary Examiner* — Dawn Garrett
(74) *Attorney, Agent, or Firm* — Lee & Morse, P.C.

(57) ABSTRACT

An organic light-emitting device includes an emission layer between first and second electrodes, a first hole transport layer that is between the emission layer and the first electrode and that includes a first hole transport compound and a first electron acceptor, a second hole transport layer that is between the emission layer and first hole transport layer and that includes a second hole transport compound, a third hole transport layer that is between the emission layer and the second hole transport layer and that includes a third hole transport compound and a second electron acceptor, a fourth hole transport layer that is between the emission layer and the third hole transport layer and that includes a fourth hole transport compound, a buffer layer between the emission layer and the fourth hole transport layer, and an electron transport layer that includes a pyrimidine-based compound.

20 Claims, 4 Drawing Sheets

(56) References Cited

FOREIGN PATENT DOCUMENTS

| KR | 10-2009-0051141 A | 5/2009 |
| KR | 10-2010-0039815 A | 4/2010 |
| KR | 10-2010-0043994 A | 4/2010 |
| WO | WO 2011/021689 A1 | 2/2011 |

* cited by examiner

ORGANIC LIGHT-EMITTING DEVICE INCLUDING MULTI-LAYERED HOLE TRANSPORT LAYER, AND ORGANIC LIGHT-EMITTING DISPLAY APPARATUS INCLUDING THE SAME

CROSS-REFERENCE TO RELATED PATENT APPLICATION

This application claims priority under 35 U.S.C. §119 to Korean Patent Application No. 10-2012-0069476, filed on Jun. 27, 2012, in the Korean Intellectual Property Office, the disclosure of which is incorporated herein in its entirety by reference.

BACKGROUND

Organic light-emitting devices, which are self-emitting devices, have advantages such as wide viewing angles, excellent contrast, quick response, high brightness, excellent driving voltage characteristics, and may provide multicolored images. Due to these characteristics organic light-emitting devices have been receiving growing attention.

SUMMARY

Embodiments may be realized by providing an organic light-emitting device that includes a substrate, a first electrode disposed on the substrate, a second electrode disposed opposite to the first electrode, an emission layer disposed between the first electrode and the second electrode, a first hole transport layer disposed between the emission layer and the first electrode, and including a first hole transport compound and a first electron acceptor, a second hole transport layer disposed between the emission layer and first hole transport layer, and including a second hole transport compound, a third hole transport layer disposed between the emission layer and the second hole transport layer, and including a third hole transport compound and a second electron acceptor, a fourth hole transport layer disposed between the emission layer and the third hole transport layer, and including a fourth hole transport compound, a buffer layer disposed between the emission layer and the fourth hole transport layer, and an electron transport layer disposed between the emission layer and the second electrode, and including a pyrimidine-based compound.

The first hole transport compound and the third hole transport compound each independently include a compound represented by Formula 1, and the second hole transport compound and the fourth hole transport compound each independently include a compound represented by Formula 2:

Formula 1

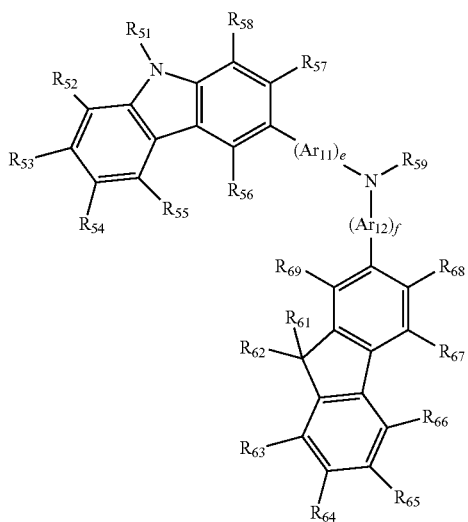

In Formula 1, $Ar_{11}$ and $Ar_{12}$ are each independently a substituted or unsubstituted $C_6$-$C_{30}$ arylene group; e and f are each independently an integer from 0 to 5; $R_{51}$ to $R_{58}$ and $R_{61}$ to $R_{69}$ are each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, and a substituted or unsubstituted $C_6$-$C_{30}$ arylthio group; and $R_{59}$ is one of a substituted or unsubstituted phenyl group, a substituted or unsubstituted naphthyl group, a substituted or unsubstituted anthryl group, a substituted or unsubstituted biphenyl group, and a substituted or unsubstituted pyridyl group, Formula 2

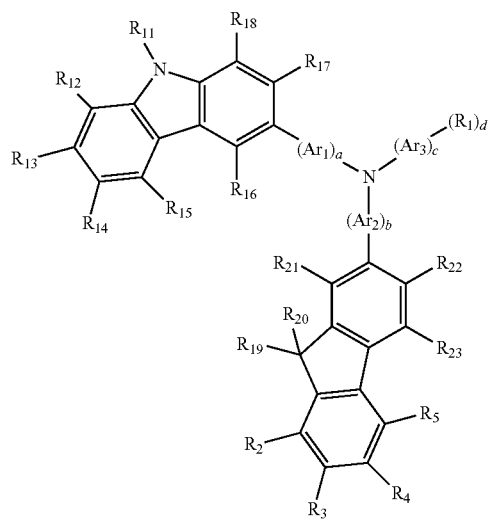

In Formula 2, $Ar_1$ to $Ar_3$ are each independently a substituted or unsubstituted $C_6$-$C_{30}$ arylene group; a and b are each independently an integer from 0 to 5; c is an integer from 1 to 5; $R_1$ to $R_5$ are each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, —Si($R_{31}$)($R_{32}$)($R_{33}$), —N($R_{34}$)($R_{35}$), and a nitrogen atom-containing group, wherein at least one of $R_1$ to $R_5$ is a nitrogen atom-containing group; d is an integer from 0 to 5.

$R_{11}$ to $R_{23}$ are each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_3$ aryl group, a substituted or unsubstituted $C_6$-$C_{30}$ aryloxy group, a substituted or unsubstituted $C_6$-$C_{30}$ arylthio group, —Si($R_{36}$)($R_{37}$)($R_{38}$), and —N($R_{39}$)($R_{40}$).

$R_{31}$ to $R_{40}$ are each independently at least one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$alkyl group, a substituted or unsubstituted $C_2$-$C_{30}$ alkenyl group, a substituted or unsubstituted $C_2$-$C_{30}$alkynyl group, a substituted or unsubstituted $C_1$-$C_{30}$alkoxy group, a substituted or unsubstituted $C_3$-$C_{30}$ cycloalkyl group, a substituted or unsubstituted $C_6$-$C_{30}$aryl group, a substituted or unsubstituted $C_6$-$C_{30}$aryloxy group, a substituted or unsubstituted $C_6$-$C_{30}$ arylthio group, and a substituted or unsubstituted $C_2$-$C_{30}$ heteroaryl group.

The nitrogen atom-containing group is a ring group with at least one nitrogen as a ring atom selected from among a 5-membered aromatic ring group, a 6-membered aromatic ring group, and a 9-membered aromatic ring group fused from 5-membered and 6-membered aromatic groups.

The first electron acceptor and the second electron acceptor may each independently include at least one of compounds 501 and 502 below:

Compound 501

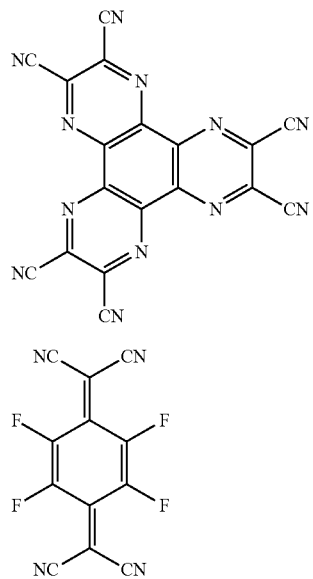

Compound 502

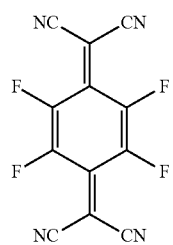

An amount of the first electron acceptor may be from about 1 part to about 3 parts by weight based on 100 parts by of the first hole transport layer.

An amount of the second electron acceptor may be from about 1 part to about 3 parts by weight based on 100 parts by weight of the third hole transport layer.

The first hole transport layer and the third hole transport layer may be the same, and the second hole transport layer and the fourth hole transport layer may be the same.

The first hole transport layer may have a thickness of about 50 Å to about 400 Å, and the second hole transport layer may have a thickness of about 200 Å to about 800 Å.

The buffer layer may include the first hole transport compound.

The buffer layer may have a thickness of about 100 Å to about 1000 Å.

The pyrimidine-based compound may be represented by Formula 3 below:

Formula 3

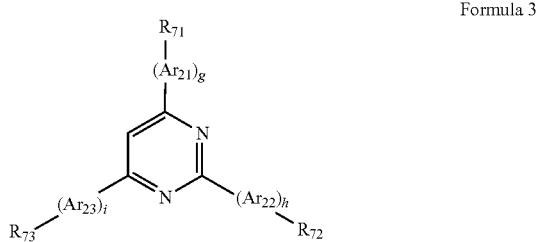

In Formula 3, $Ar_{21}$, $Ar_{22}$, and $Ar_{23}$ are each independently a substituted or unsubstituted $C_6$-$C_{30}$ arylene group; $R_{71}$, $R_{72}$, and $R_{73}$ are each independently a substituted or unsubstituted $C_2$-$C_{30}$ heteroaryl group; and g, h, and i are each independently an integer from 0 to 5.

The pyrimidine-based compound may have a lowest unoccupied molecular orbital (LUMO) energy level of from about −2.4 eV to about −2.8 eV, and have a highest occupied molecular orbital (HOMO) energy level of from about −6.5 eV to about −6.0 eV.

The pyrimidine-based compound may include at least one of Compounds 701 to 704 below:

701

701

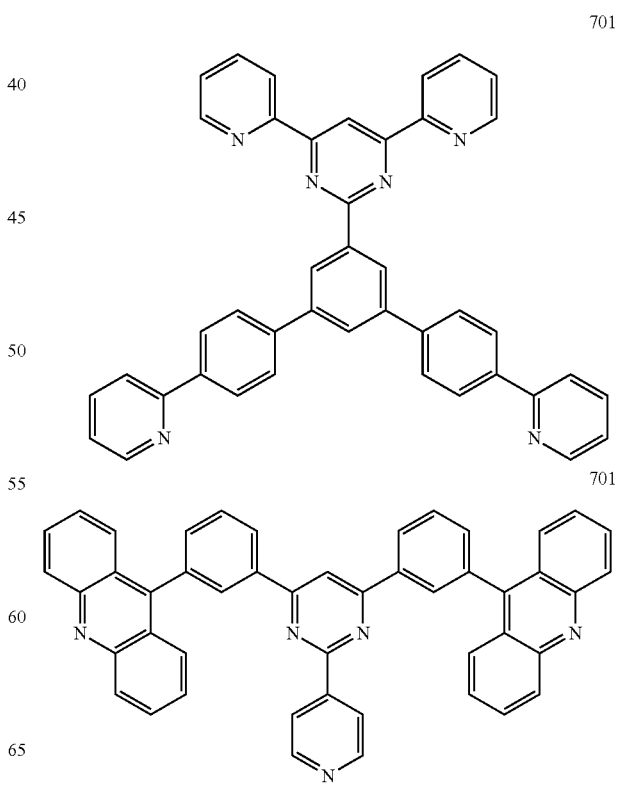

-continued

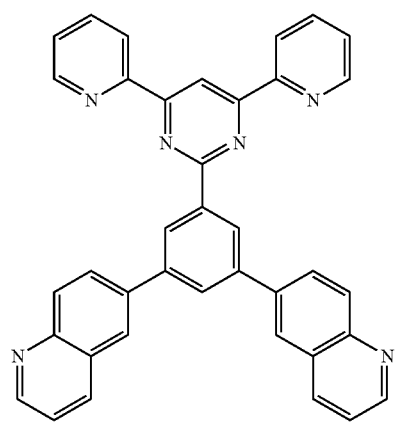

703

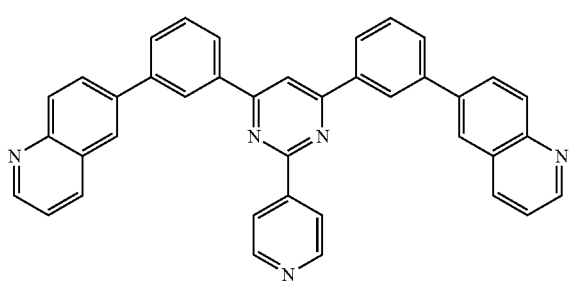

704

The first electrode and the first hole transport layer may contact each other.

The organic light-emitting device may further include an electron injection layer between the second electrode and the emission layer.

The electron injection layer may include at least one of lithium quinolate (LiQ), lithium fluoride (LiF), and Compound 101 below:

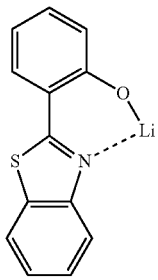

101

Embodiments may also be realized by providing an organic light-emitting display device that includes a transistor including a source, a drain, a gate, and an active layer, and any of the above-described organic light-emitting devices, wherein one of the source and the drain is electrically connected to the first electrode of the organic light-emitting device.

BRIEF DESCRIPTION OF THE DRAWINGS

Features will become apparent to those of ordinary skill in the art by describing in detail exemplary embodiments thereof with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, the term "and/or" includes any and all combinations of one or more of the associated listed items. Expressions such as "at least one of," when preceding a list of elements, modify the entire list of elements and do not modify the individual elements of the list.

Figure 1:
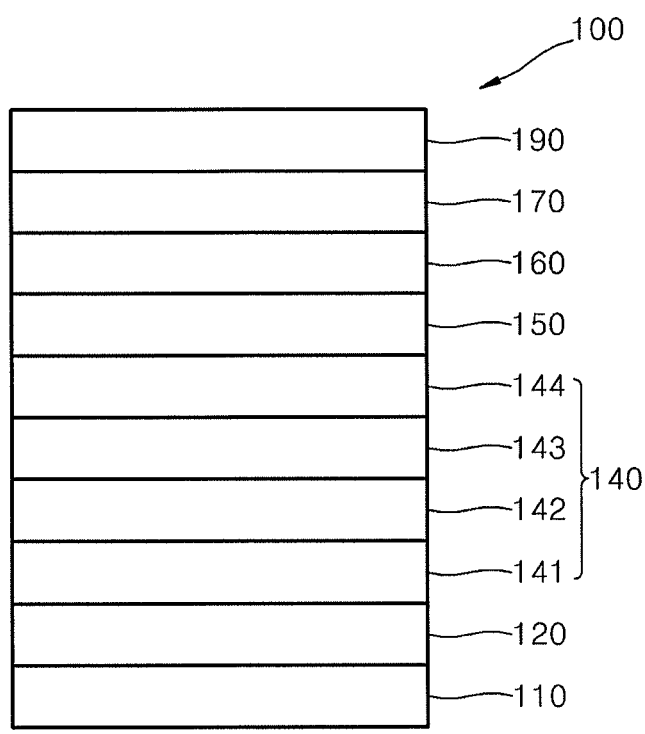
FIG. 1 is a schematic cross-sectional view of a structure of an organic light-emitting device according to an exemplary embodiment.

FIG. 1 is a cross-sectional view of the structure of an organic light-emitting device 100 according to an exemplary embodiment.

Referring to FIG. 1, the organic light-emitting device 100 includes: a substrate 110; a first electrode 120 disposed on the substrate 110; a second electrode 190 disposed opposite to the first electrode 120; an emission layer (EML) 160 disposed between the first electrode 120 and the second electrode 190; a first hole transport layer (HTL) 141 disposed between the EML 160 and the first electrode and including a first hole transport compound and a first electron acceptor; a second HTL 142 disposed between the EML 160 and the first HTL 141 and including a second hole transport compound; a third HTL 143 disposed between the EML 160 and the second HTL 142 and including a third hole transport compound and a second electron acceptor; a fourth HTL 144 disposed between the EML 160 and the third HTL 143 and including a fourth hole transport compound; a buffer layer 150 disposed between the EML 160 and the fourth HTL 144; and an electron transport layer (ETL) 170 disposed between the EML 160 and the second electrode 190 and including a pyrimidine-based compound.

In some embodiments, the organic light-emitting device 100 may be a stack structure of the substrate 110, the first electrode 120, the HTL 140, the buffer layer 150, the EML 160, the ETL 170, and the second electrode 190 that are sequentially stacked upon one another. The HTL 140 may have a multi-layered structure including a first HTL 141, a second HTL 142, a third HTL 143, and a fourth HTL 144. The multi-layered HTL 140 may be applicable in either a top-emission type or a bottom-emission type light-emitting device.

In contrast, according to an existing organic light-emitting device such as one that includes a single layered HTL, the HTL is formed using a hole transport material that is doped with a p-type dopant or mixed with a high-conductivity hole injecting material to reduce a driving voltage of the organic light-emitting device, thereby improving hole injection characteristics. However, this method may reduce a driving voltage of the organic light-emitting device due to injection of excessive charges caused from the use of the hole transport material with improved hole transport characteristics. Further, the hole transport material is likely to be degraded by electrons injected into the organic light-emitting device, so that light emission near at an interface between the HTL and the EML may be accompanied with an increased non-radiative quenching, so that efficiency and lifetime of the organic light-emitting device may be reduced.

Accordingly, in an exemplary embodiment, the organic light-emitting device 100 may include the multi-layered HTL 140 including at least two hole transport materials with different energy levels, whereas some layers of the HTL 140 may be doped with an electron acceptor.

In the multi-layered HTL 140 of the organic light-emitting device 100, the first HTL 141 and the third HTL 143 may be doped with different electron acceptors, respectively.

A first electron acceptor in the first HTL 141 may strongly pull electrons generated from chemical reaction with a first hole transport compound, and release holes. As a result, the first HTL 141 has an increased amount of free holes with improved conductivity, so that a lowered injection barrier to the first HTL 141 may facilitate injection and transport of holes, and thus the driving voltage of the organic light-emitting device may be reduced.

Likewise, a second electron acceptor in the third HTL 143 may strongly pull electrons generated from chemical reaction with a third hole transport compound, and release holes. As a result, the third HTL 143 has an increased amount of free holes with improved conductivity, so that a lowered injection barrier to the third HTL 143 may facilitate injection and transport of holes, and thus the driving voltage of the organic light-emitting device may be reduced.

Based on the reduced resistance at an interface between the first electrode 120 and the first HTL 141 and further inclusion of the third HTL 143 and the fourth HTL 144 that have the same characteristics as the first HTL 141 and the second HTL 142, respectively, the multi-layered HTL 140 may improve stability of the organic light-emitting display device.

In the organic light-emitting device 100, each of the layers forming the multi-layered HTL 140 may be formed from a hole transport material with a different energy level. In particular, the first HTL 141 may include a first hole transport compound and a first electron acceptor; the second HTL 142 may include a second hole transport compound; the third HTL 143 may include a third hole transport compound and a second electron acceptor; and the fourth HTL 144 may include a fourth hole transport compound.

The first hole transport compound and the third hole transport compound may each independently include a compound represented by Formula 1 below:

Formula 1

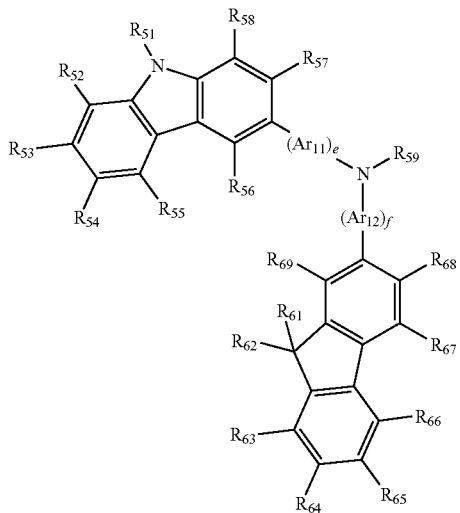

In Formula 1 above, $Ar_{11}$ and $Ar_{12}$ may be each independently a substituted or unsubstituted $C_6$-$C_{30}$ arylene group. The phrase $C_6$-$C_{30}$ arylene group refers to an arylene group that includes 6 to 30 carbon atoms forming the arylene group.

In some embodiments, $Ar_{11}$ to $Ar_{12}$ may be each independently one of a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, and a substituted or unsubstituted hexacenylene group.

In Formula 1 above, e and f may be each independently an integer from 0 to 5.

When e and/or f is 0, a carbazole ring and/or fluorene ring in Formula 1 may be directly linked to a nitrogen atom in the middle of Formula 1. For example, d, e, f, and g may be each independently 0, 1, or 2, but are not limited thereto. If e is 2 or greater, at least two $Ar_{11}$ may be the same or different. If f is 2 or greater, at least two $Ar_{12}$ may be the same or different.

In Formula 1, $R_{51}$ to $R_{58}$ and $R_{61}$ to $R_{69}$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, and a substituted or unsubstituted $C_6$-$C_{30}$ arylthio group.

In Formula 1, $R_{59}$ may be one of a substituted or unsubstituted phenyl group, a substituted or unsubstituted naphthyl group, a substituted or unsubstituted anthryl group, a substituted or unsubstituted biphenyl group, and a substituted or unsubstituted pyridyl group.

The first hole transport compound and the third hole transport compound may include each independently a compound represented by Formula 1A below:

Formula 1A

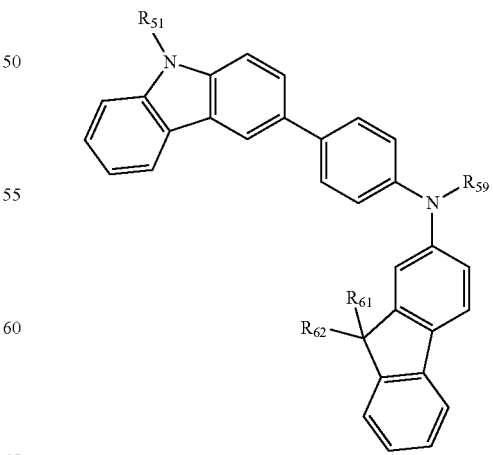

In Formula 1A, $R_{51}$, $R_{59}$, $R_{61}$, and $R_{62}$ are as defined above in connection with Formula 1.

For example, the first hole transport compound and the third hole transport compound may include Compound 31 below, but is not limited thereto.

Compound 301

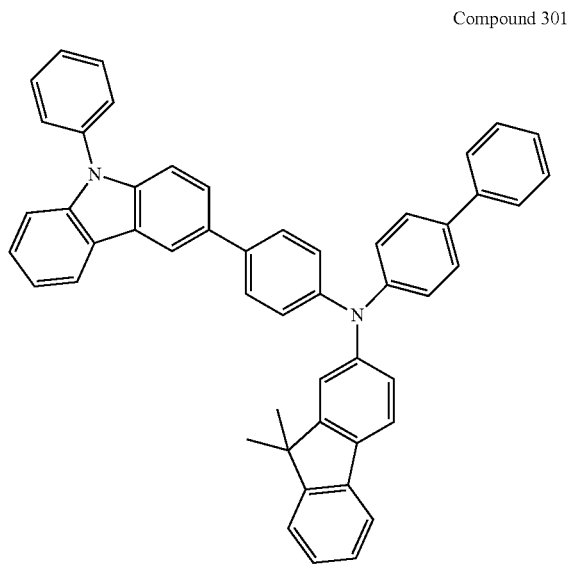 [SMILES: CC1(C)c2ccccc2-c2ccc(N(c3ccc(-c4ccccc4)cc3)c3ccc(-c4ccc5c(c4)c4ccccc4n5-c4ccccc4)cc3)cc21]

The second hole transport compound and the fourth hole transport compound may include each independently a compound represented by Formula 2 below:

Formula 2

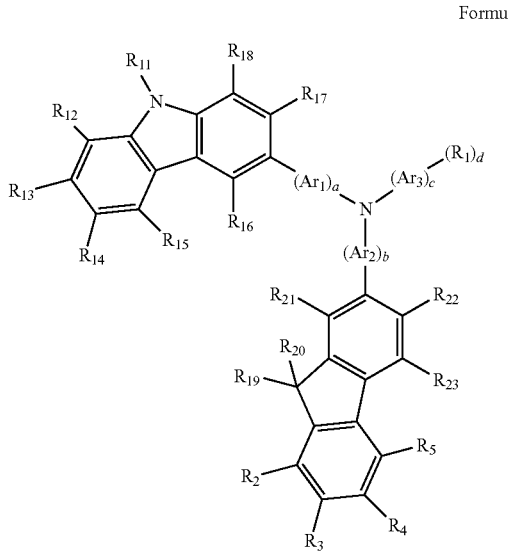

In Formula 2 above, $Ar_1$ to $Ar_3$ may be each independently a substituted or unsubstituted $C_6$-$C_{30}$ arylene group.

In some embodiments, $Ar_1$ to $Ar_3$ may be each independently one of a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenyllenylene group, a substituted or unsubstituted pyrenylene group, a substituted or unsubstituted chrycenylene group, a substituted or unsubstituted naphthacenylene group, a substituted or unsubstituted picenylene group, a substituted or unsubstituted perylenylene group, a substituted or unsubstituted pentacenylene group, and a substituted or unsubstituted hexacenylene group.

In Formula 2 above, a and b may be each independently an integer from 0 to 5. When e and/or f is 0, a carbazole ring and/or fluorene ring in Formula 2 may be directly linked to a nitrogen atom in the middle of Formula 2 For example, a and b may be each independently 0, 1, or 2, but are not limited thereto. If a is 2 or greater, at least two $Ar_1$ may be the same or different. If b is 2 or greater, at least two $Ar_2$ may be the same or different.

In Formula 2, c may be an integer of from 1 to 5. Since c is an integer of from 1 to 5, $Ar_3$ is always in the compound of Formula 1. For example, c may be an integer of 1 or 2, but is not limited thereto. If c is 2 or greater, at least two $Ar_3$ may be the same or different.

In Formula 2, $R_1$ to $R_5$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, —Si($R_{31}$)($R_{32}$)($R_{33}$), —N($R_{34}$)($R_{35}$), and a nitrogen atom-containing group, wherein at least one of $R_1$ to $R_5$ may be a nitrogen atom-containing group, wherein $R_{31}$ to $R_{35}$ will be described later.

In some embodiments, $R_1$ to $R_5$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{10}$ alkyl group, a substituted or unsubstituted $C_1$-$C_{10}$ alkoxy group, a substituted or unsubstituted $C_5$-$C_{20}$ aryl group, and a nitrogen atom-containing group, wherein at least one of $R_1$ to $R_5$ may be a nitrogen atom-containing group.

The nitrogen atom-containing group is a ring group with at least one nitrogen as a ring atom selected from among a 5-membered aromatic ring group, a 6-membered aromatic ring group, and a 9-membered aromatic ring group fused from 5-membered and 6-membered aromatic groups. For example, the nitrogen atom-containing group may be represented by one of the following Formulae 4A to 4P.

Formula 4A

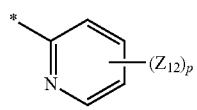

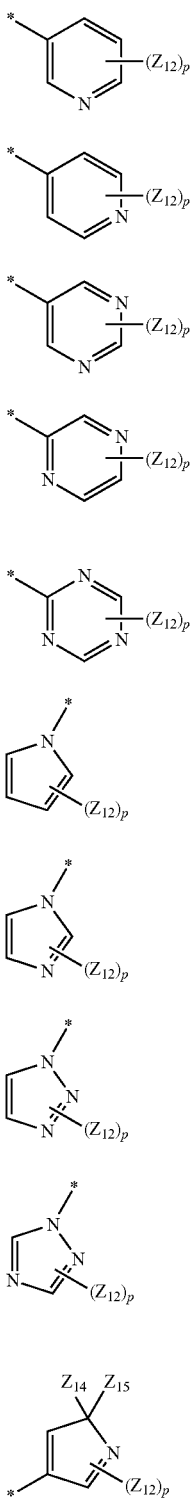
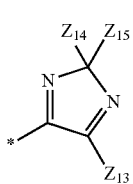
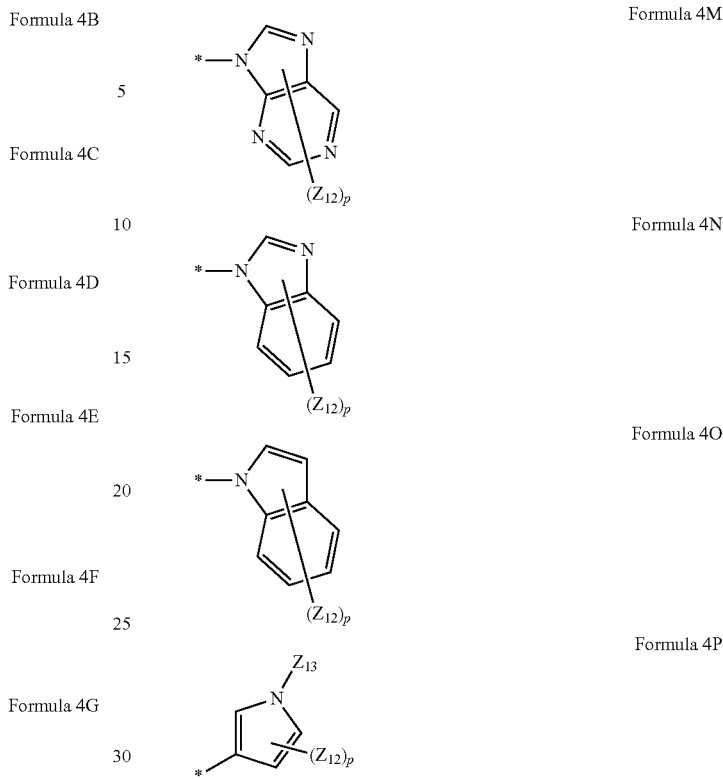

In Formulae 4A to 4P, $Z_{12}$, $Z_{13}$, $Z_{14}$, and $Z_{15}$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a methyl group, an ethyl group, a propyl group, or a butyl group. For example, in Formulae 4A to 4P, $Z_{12}$, $Z_{13}$, $Z_{14}$, and $Z_{15}$ may be all a hydrogen atom. In Formulae 4A to 4P, p is an integer of from 1 to 6. If p is 2 or greater, at least two $Ar_3$ may be the same or different.

In Formula 2, d may be an integer of from 0 to 5. For example, d may be an integer of 0, 1 or 2, but is not limited thereto. If d is 2 or greater, at least two $R_1$ may be the same or different.

In Formula 2, $R_{11}$ to $R_{23}$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, —Si($R_{36}$)($R_{37}$)($R_{38}$), and —N($R_{39}$)($R_{40}$);

In some embodiments, $R_{12}$ to $R_{18}$ and $R_{21}$ to $R_{23}$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, or phosphoric acid or a salt thereof; and $R_{11}$, $R_{19}$, and $R_{20}$ may be each independently one of a hydrogen atom, a methyl group, an ethyl group, a propyl group, a butyl group, a pentyl group, a phenyl group, a naphthyl group, an anthryl group, a fluorenyl group, and a pyrenyl group, but are not limited thereto.

In the groups of —Si($R_{31}$)($R_{32}$)($R_{33}$), —N($R_{34}$)($R_{35}$), —Si($R_{36}$)($R_{37}$)($R_{38}$), and —N($R_{39}$)($R_{40}$), $R_{31}$ to $R_{40}$ may be each independently at least one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group. In some embodiments, $R_{31}$ to $R_{40}$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted methyl group, a substituted or unsubstituted ethyl group, a substituted or unsubstituted propyl group, a substituted or unsubstituted butyl group, a substituted or unsubstituted pentyl group, a substituted or unsubstituted hexyl group, a substituted or unsubstituted methoxy group, a substituted or unsubstituted ethoxy group, a substituted or unsubstituted propoxy group, a substituted or unsubstituted butoxy group, a substituted or unsubstituted pentoxy group, a substituted or unsubstituted phenyl group, a substituted or unsubstituted naphthyl group, a substituted or unsubstituted anthryl group, a substituted or unsubstituted fluorenyl group, and a substituted or unsubstituted pyrenyl group, but are not limited thereto.

In Formula 2, R1 may be a nitrogen atom-containing group; and c and d may be each independently 1 or 2. In Formula 2, at least one of $R_2$ to $R_5$ may be a nitrogen atom-containing group.

The second hole transport compound and the fourth hole transport compound may each independently include at least one of compounds represented by Formulae 2A to 2K:

Formula 2A

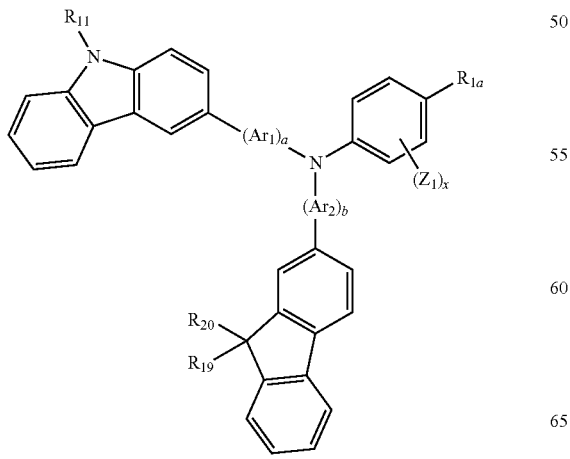

Formula 2B

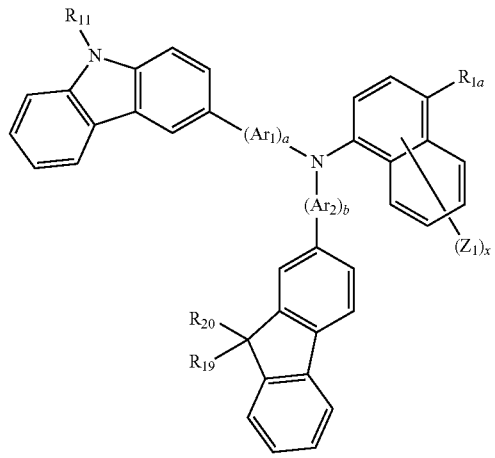

Formula 2C

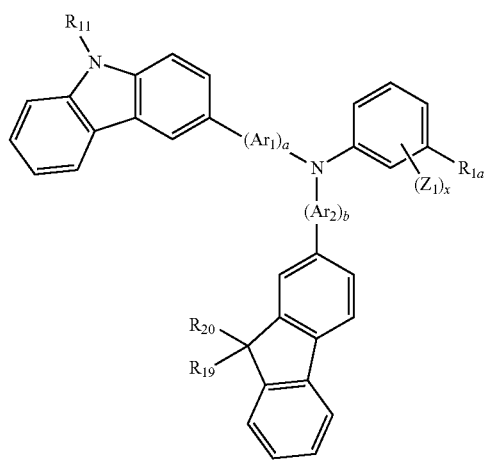

Formula 2D

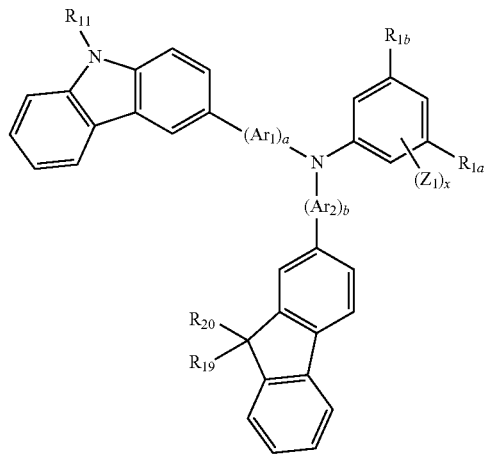

Formula 2E
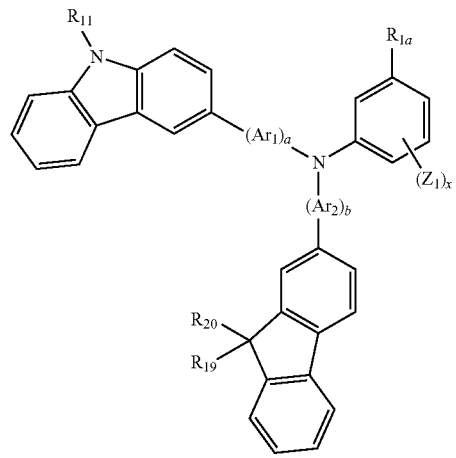
Formula 2F
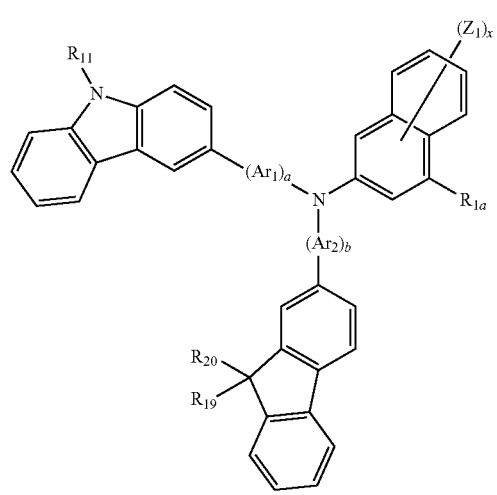
Formula 2G
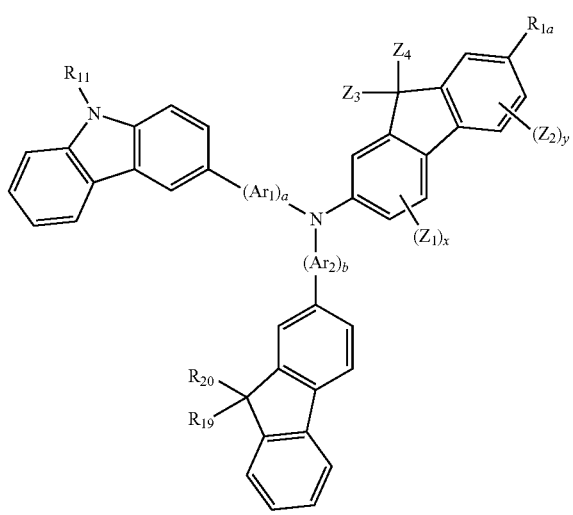
Formula 2H
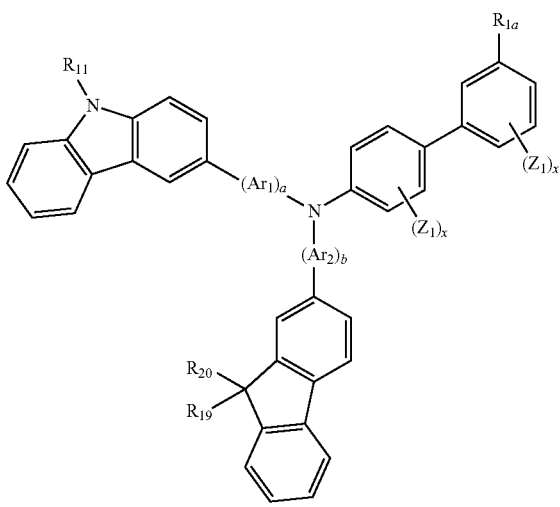
Formula 2I
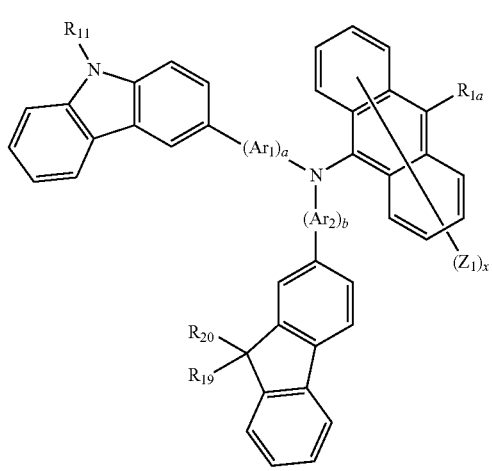
Formula 2J
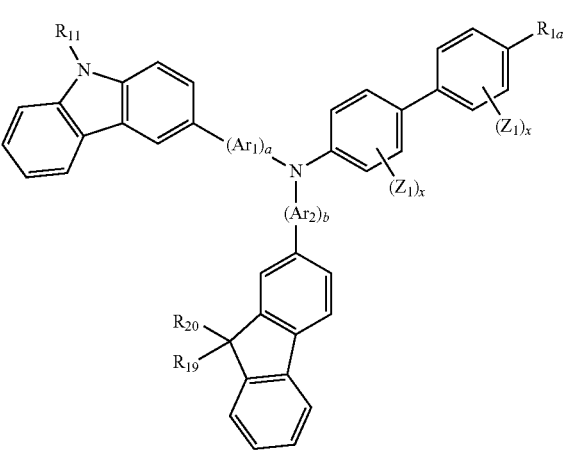

-continued

Formula 2K

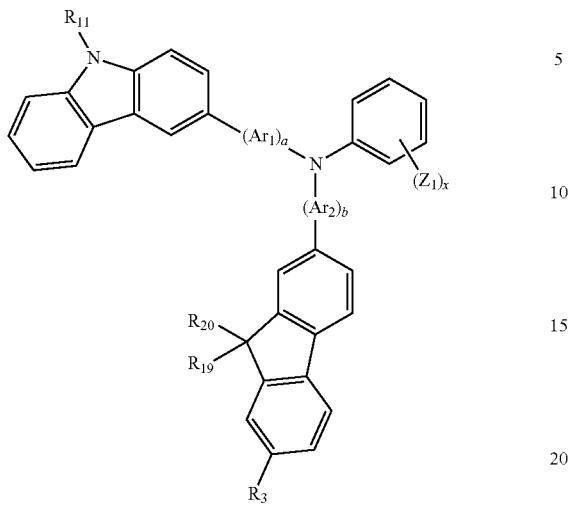

In Formulae 2A to 2K, $Ar_1$ and $Ar_2$ may be each independently a substituted or unsubstituted $C_6$-$C_{30}$ arylene group; a and b may be each independently an integer of from 0 to 5; $R_{1a}$, $R_{1b}$ and $R_3$ may be each independently a nitrogen atom-containing group; $R_{11}$, $R_{19}$, and $R_{20}$ may be each independently one of a substituted or unsubstituted $C_1$-$C_{30}$ alkyl group, and a substituted or unsubstituted $C_5$-$C_{30}$ aryl group. The nitrogen atom-containing group is as described above in the specification.

In Formulae 2A to 2K, $Z_1$ to $Z_4$ may be each independently one of a hydrogen atom, a deuterium atom, a halogen atom, a hydroxyl group, a cyano group, a nitro g group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_3$ alkoxy group, a substituted or unsubstituted $C_3$-$C_{30}$ cycloalkyl group, a substituted or unsubstituted $C_5$-$C_{30}$ aryl group, a substituted or unsubstituted $C_5$-$C_{30}$ aryloxy group, a substituted or unsubstituted $C_5$-$C_{30}$ arylthio group, —$Si(Q_1)(Q_2)(Q_3)$, and —$N(Q_4)(Q_5)$, wherein, when x or y may be at least two in number, a plurality of $Z_1$ or $Z_2$ may be the same or different. In Formulae 2A to 2K, x may be an integer of from 1 to 8; and y may be an integer of from 1 to 3.

$Q_1$ to $Q_5$ may be each independently one of a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, and a substituted or unsubstituted $C_2$-$C_{30}$ heteroaryl group.

For example, the second hole transport compound and the fourth hole transport compound may each independently include at least one of compounds 2, 8, 14, 15, 16, 20, 31, and 35 below, but are not limited thereto:

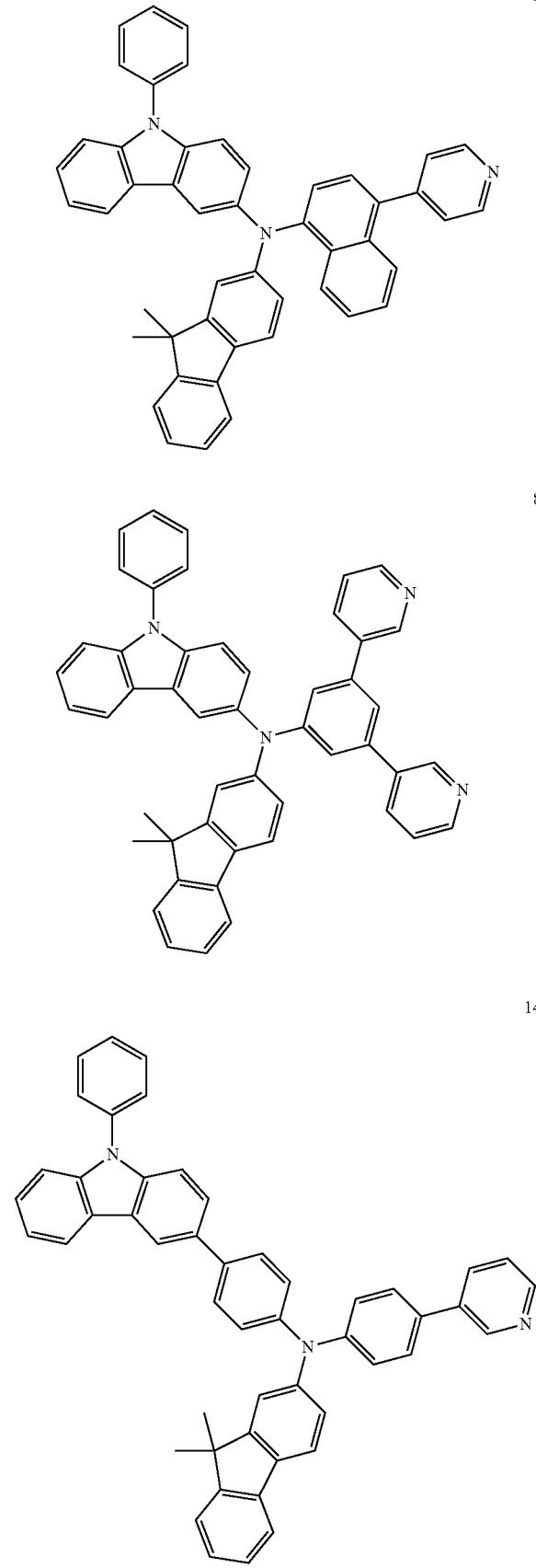

15
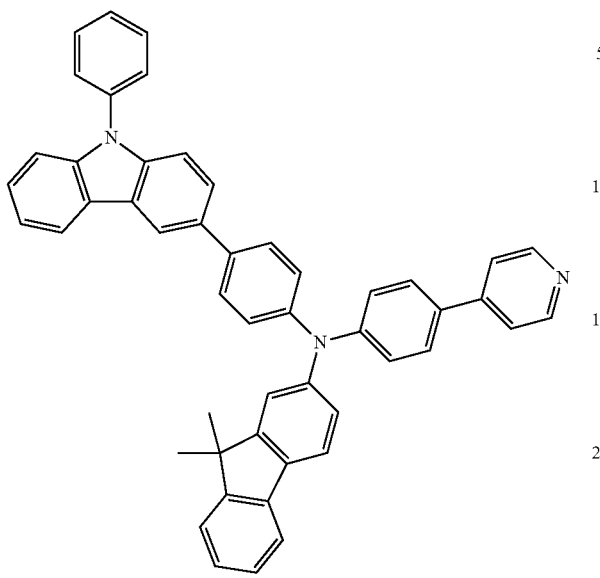
20
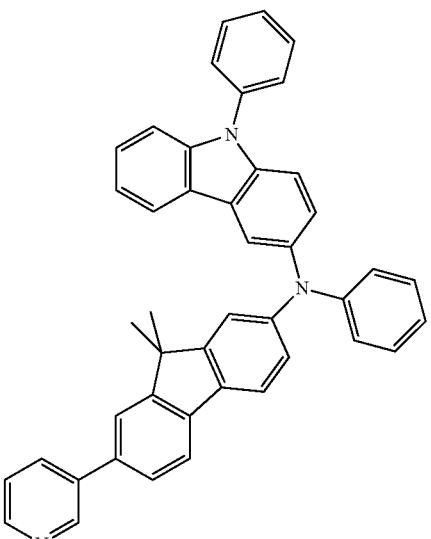
16
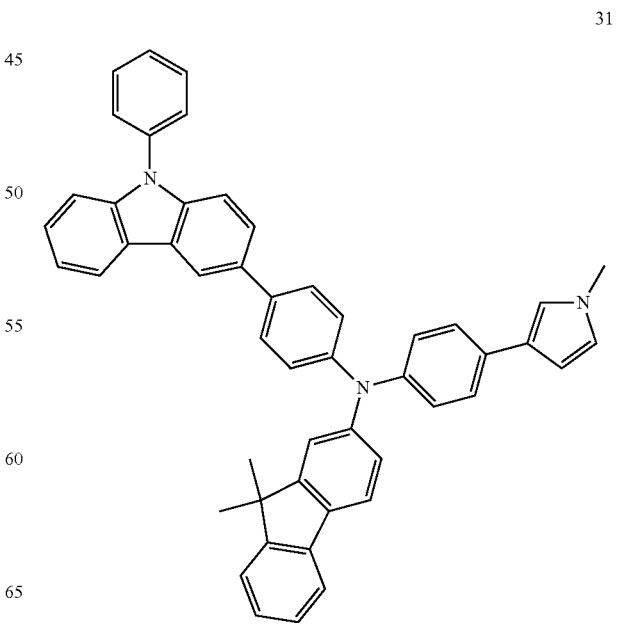
31

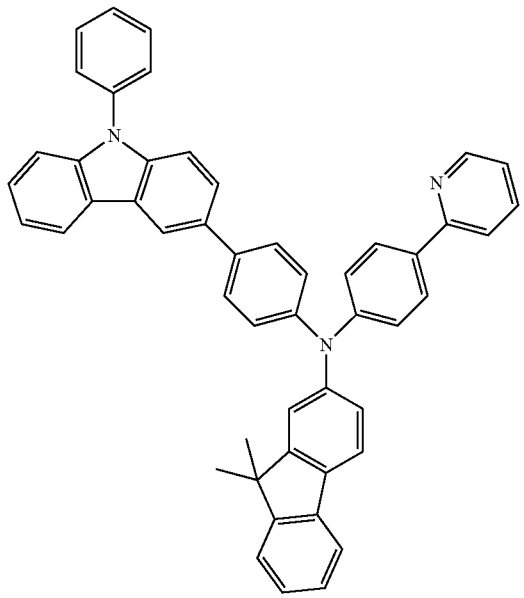

The first hole transport compound may have high hole mobility and high hole injecting ability. The second hole transport compound may have lower hole mobility and a higher electron trapping function as compared with the first hole transport compound.

A relationship between the third hole transport compound and the fourth hole transport compound may be the same as that of between the first hole transport compound and the second hole transport compound. The third hole transport compound may have high hole mobility and high hole injecting ability. The fourth hole transport compound may have lower hole mobility and a higher electron trapping function as compared with the third hole transport compound. For example, a highest occupied molecular orbital (HOMO) energy level of the fourth hole transport compound is lower than that of the third hole transport compound by about 0.1 eV to about 0.2 eV. A lowest unoccupied molecular orbital (LUMO) energy level of the fourth hole transport compound is lower than that of the third hole transport compound by about 0.1 eV to about 0.2 eV.

In general, when light emission occurs near an interface between the HTL and EML, due to an increased nonradiative quenching, the organic light-emitting device may have reduced efficiency and lifetime. In this regard, a material capable of trapping electrons at the interface between the EML and the adjacent HTL may be used to reduce the non-radiative quenching, which may be conducive to improving lifetime of the organic light-emitting device.

Therefore, the second hole transport compound with a better electron trapping function may be used in the second HTL 142 that is nearer to the EML 160 than the first HTL 141. Likewise, the fourth hole transport compound with a better electron trapping function may be used in the fourth HTL 144 that is closer to the EML 160 than the third HTL 143.

The second hole transport compound may reduce exiton quenching by trapping electrons in the second HTL 142, and thus may improve the lifetime of the organic light-emitting device. The fourth hole transport compound may reduce exiton quenching by trapping electrons in the fourth HTL 144 by trapping electrons in the fourth HTL 144, and thus may improve the lifetime of the organic light-emitting device.

In particular, electron trapping mostly occurs in the fourth HTL 144 that is closest to the EML 150, reducing exiton quenching, and thus improving lifetime of the organic light-emitting device.

If there is a great difference in LUMO and HOMO energy levels between the second hole transport compound and the first hole transport compounds, the driving voltage may likely be increased excessively.

In some embodiments, the LUMO energy level of the second hole transport compound may be lower than that of the first hole transport compound by about 0.1 eV to about 0.2 eV, and the HOMO energy level of the second hole transport compound may be lower than that of the first hole transport compound by about 0.1 eV to about 0.2 eV. When differences in LUMO and HOMO energy levels between the first hole transport compound and the second hole transport compound are within these ranges, electrons may be trapped without excessive rise in driving voltage, so that migration of injected charges may be facilitated.

Likewise, in some embodiments, the LUMO energy level of the fourth hole transport compound may be lower than that of the third hole transport compound by about 0.1 eV to about 0.2 eV, and the HOMO energy level of the fourth hole transport compound may be lower than that of the third hole transport compound by about 0.1 eV to about 0.2 eV. When differences in LUMO and HOMO energy levels between the third hole transport compound and the fourth hole transport compound are within these ranges, electrons may be trapped without excessive rise in driving voltage, so that migration of injected charges may be facilitated.

Hole mobility of the first hole transport compound may be higher than that of the second hole transport compound. If this is satisfied, the driving voltage of the organic light-emitting device may reach a satisfactory level without excessive increase. Likewise, hole mobility of the third hole transport compound may be higher than that of the fourth hole transport compound.

The first electron acceptor and the second electron acceptor may be each independently a compound including at least one cyano group. In some embodiments, the first electron acceptor and the second electron acceptor may be each independently quinine derivatives, such as tetracyanoquinodimethane (TCNQ) and 2,3,5,6-tetrafluoro-tetracyano-1,4-benzoquinodimethane (F4-TCNQ), but are not limited thereto.

The first electron acceptor and the second electron acceptor may each independently include at least one of compounds 501 and 502 below:

Compound 501

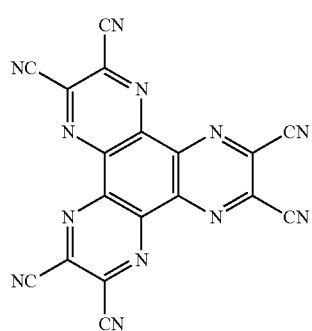

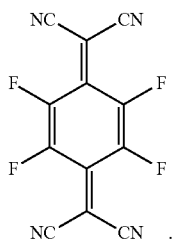

Compound 502

An amount of the first electron acceptor may be from about 1 part to about 3 parts by weight based on 100 parts by of the first hole transport layer 141. The first electron acceptor may be in any of a variety of forms in the first HTL 141, for example, may be homogeneously or in homogeneously dispersed in the first HTL 141. When the amount of the first electron acceptor is within this range, an appropriate amount of holes may be generated in the first HTL 141. Similar to the first electron acceptor, an amount of the second electron acceptor may be from about 1 part to about 3 parts by weight based on 100 parts by weight of the third HTL 143. The second electron acceptor may be in any of a variety of forms in the third HTL 143, for example, may be homogeneously or in homogeneously dispersed in the third HTL 143. When the amount of the second electron acceptor is within this range, an appropriate amount of holes may be generated in the third HTL 143.

The organic light-emitting device 100 may have a structure in which the substrate 110, the first electrode 120, the first HTL 141 including the first hole transport compound and the first electron acceptor, the second HTL 142 including the second hole transport compound, the third HTL 143 including the first hole transport compound and the first electron acceptor, the fourth HTL 144 including the second hole transport compound, the buffer layer 150, the EML 160, the ETL 170, and the second electrode 190 are sequentially disposed upon one another.

Since, in the organic light-emitting device 100 according to an exemplary embodiment, the first HTL 141 and the third HTL 143 are the same, and the second HTL 142 and the fourth HTL 144 are the same, the multi-layered HTL 140 of the organic light-emitting device 100 may be construed as including two repeating units, each including the first HTL 141 and the second HTL 142. Since the organic light-emitting device 100 includes the multi-layered HTL 140 with repeating units, a manufacturing process may be simplified. A thickness of the first HTL 141 may be from about 50 Å to about 400 Å, and a thickness of the second HTL 142 may be from about 200 Å to about 800 Å. When the thicknesses of the first HTL 141 and the second HTL 142 are within these ranges, mobility of homes may be appropriately controlled without a substantial increase in driving voltage.

The buffer layer 150 may be disposed between the EML 160 and the fourth HTL 144. When the EML 160 and the fourth HTL 144 contact each other, the fourth HTL 144 may withdraw electrons from the EML 160, thus reducing lifetime of the EML 160. In an effort to reduce the possibility of and/or prevent this, the buffer layer 150 may be disposed between the EML 160 and the fourth HTL 144 to prevent such pulling of electrons and improve lifetime of the organic light-emitting device. The buffer layer 150 may compensate for an optical resonance distance of light according to a wavelength of the light emitted from the EML 160, and thus may increase efficiency. The buffer layer 150 may be formed from a first hole transport compound with high hole mobility, or from a first hole transport compound doped with a first electron acceptor.

In some embodiments, the buffer layer 150 may be formed using Compound 301 below.

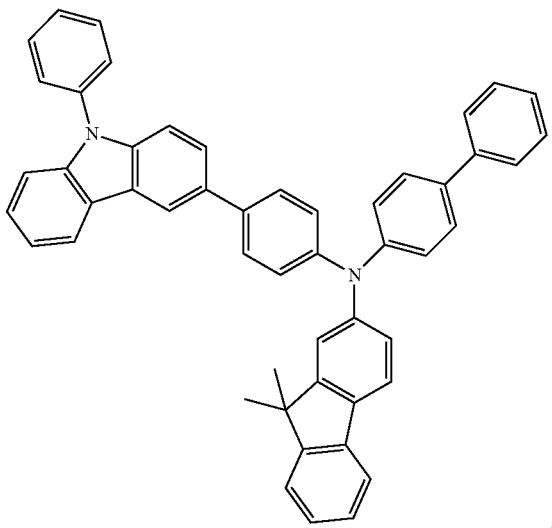

Compound 301

The buffer layer 160 may have a thickness of from about 100 Å to about 800 Å. When the thickness of the buffer layer 160 is within this range, the buffer layer 150 may compensate for an optical resonance distance according to the wavelength of the light emitted from the EML 160 without excessive increase in driving voltage, thereby improving efficiency of the organic light-emitting device.

The first HTL 141 and the second HTL 142 may contact each other. When the first HTL 141 and the second HTL 142 contact each other, a charge balance may be improved. Likewise, the third HTL 143 and the fourth HTL 144 may contact each other. When the third HTL 143 and the fourth HTL 142 contact each other, a charge balance may be improved.

The organic light-emitting device 100 may include an ETL 170 including a pyrimidine-based compound between the ETL 170 and the second electrode 190. The pyrimidine-based compound may be represented by Formula 3 below.

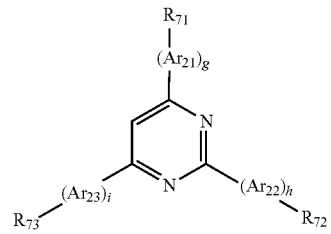

Formula 3

In Formula 3, $Ar_{21}$, $Ar_{22}$, and $Ar_{23}$ may be each independently a substituted or unsubstituted $C_6$-$C_{30}$ arylene group;

$R_{71}$, $R_{72}$ and $R_{73}$ may be each independently a substituted or unsubstituted $C_2$-$C_{30}$ heteroaryl group; and g, h, and i may be each independently an integer from 0 to 5. Non-limiting examples of the substituted $C_6$-$C_{30}$ arylene group are the unsubstituted $C_6$-$C_{30}$ arylene groups of which one hydrogen atom is substituted with a pyridinyl group, an acridinyl group, or a quinolinyl group.

The pyrimidine-based compound has a higher LUMO energy level by about 0.5 eV and a lower electron mobility, as compared with existing hole transport materials. When such a pyrimidine-based compound is used in an ETL of an organic light-emitting device with the multi-layer HTL including an electron acceptor, the lifetime characteristics of the organic light-emitting device may be significantly improved.

In some embodiments, the pyrimidine-based compound may be at least one of compounds 701 to 704:

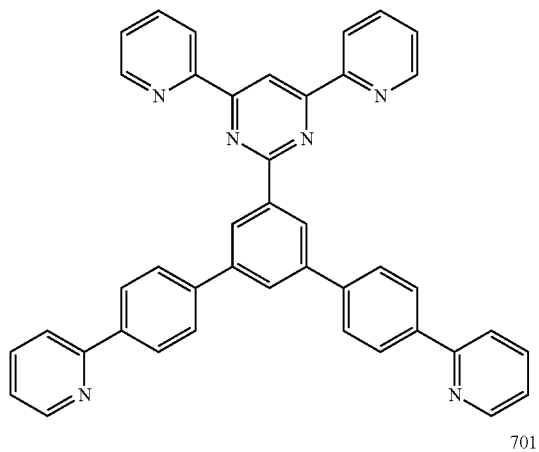

701

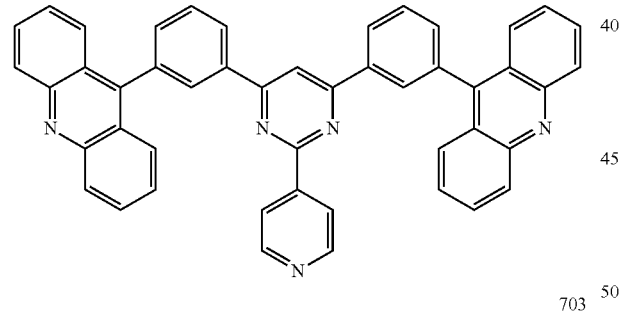

703

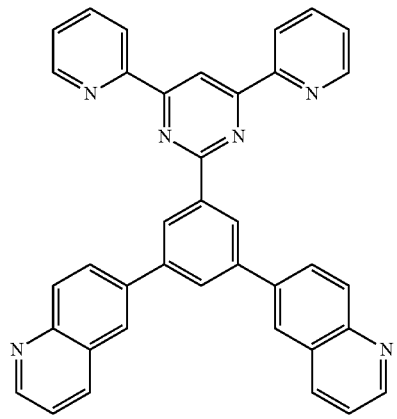

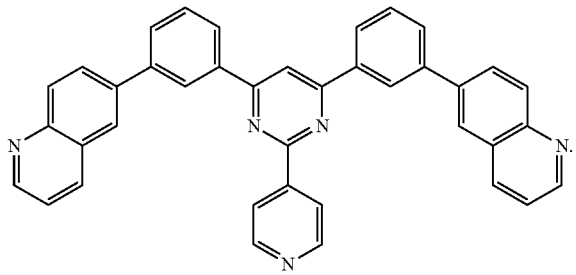

704

An ETL of an existing organic light-emitting device is formed by simultaneous deposition of an electron transport material and a metal-containing compound. However, according to an exemplary embodiment, the ETL 170 of the organic light-emitting device 100 may be formed by deposition of only one pyrimidine-based compound, which may simplify the manufacturing process.

The first HTL 141 and the first electrode 120 may contact each other. Since the first HTL 141 is formed using a first hole transport compound doped with a first electron acceptor, resistance at an interface between the first HTL 141 and the first electrode 120 may be reduced, and forming the HTL is not necessary.

The EIL (not shown) may be further disposed between the ETL 170 and the second electrode 190.

In this regard, the EIL may be formed of a meta-containing compound, for example, which may be a lithium (Li) complex. Non-limiting examples of the Li complex are lithium quinolate (LiQ), lithium fluoride (LiF), and Compound 101 below:

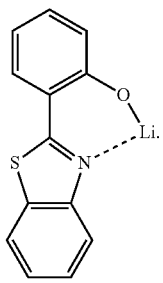

101

When the EIL is formed using lithium quinolate (LiQ), lithium fluoride (LiF), or Compound 101 below, the EIL may have satisfactory electron injection and transport characteristics.

In some embodiments, the organic light-emitting device 100 may have a structure including a "first electrode/a first HTL using the first hole transport compound doped with the first electron acceptor/a second HTL using the second hole transport compound/a third HTL using the third hole transport compound doped with a second electron acceptor/a fourth HTL using the fourth hole transport compound/a buffer layer/an EML/an ETL/an EIL/a second electrode", or a structure including a "first electrode/a first HTL using the first hole transport compound doped with the first electron acceptor/a second HTL using the second hole transport compound/a third HTL using the first hole transport compound doped with the first electron acceptor/a fourth HTL using the second hole transport compound/a buffer layer/an EML/an ETL/an EIL/and a second electrode".

Figure 2:
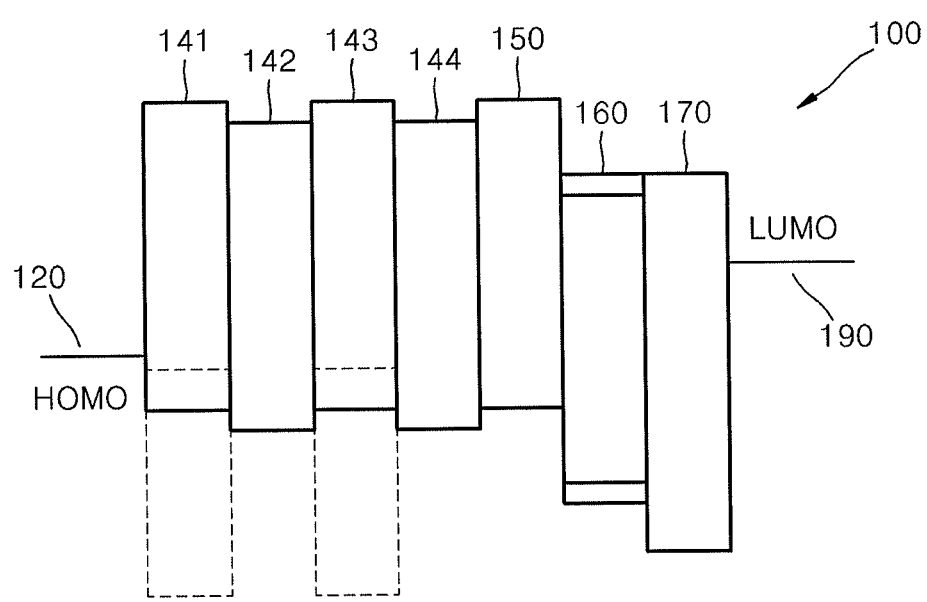
FIG. 2 is a conceptual view of energy levels of layers forming the organic light-emitting device of FIG. 1, according to an exemplary embodiment.

FIG. 2 is a conceptual view of energy levels of layers forming the organic light-emitting device of FIG. 1, according to an exemplary embodiment.

Referring to FIG. 2, the first HTL 141 may include a first hole transport compound doped with a first electron acceptor, and the third HTL 143 may include a third hole transport compound doped with a second electron acceptor, wherein the first hole transport compound and the third hole transport compound may be a compound represented by Formula 1, so that the first HTL 141 and the third HTL 143 may be similar in LUMO energy level and HOMO energy level. The second HTL 142 may include a second hole transport compound, and the fourth HTL 144 may include a fourth hole transport compound, wherein the second HTL 142 and the fourth HTL 144 are composed of a compound represented by Formula 2, so that the second HTL 142 and the fourth HTL 144 may be similar in LUMO energy level and HOMO energy level.

The first electron acceptor and the second electron acceptor have considerably low LUMO energy levels and HOMO energy levels, which are denoted by dashed lines in the first HTL 141 and the third HTL 143 in FIG. 2. Due to these characteristics of the first and second electron acceptors, the first HTL 141 and the third HTL 143 including the first and second electron acceptors, respectively, may be conducive to reducing driving voltage of the organic light-emitting device.

The LUMO energy level and HOMO energy level of the second hole transport compound in the second HTL 142 may be each lower by about 0.1 ev as compared with the LUMO energy level and HOMO energy level of the first hole transport compound in the first HTL 141. Likewise, the LUMO energy level and HOMO energy level of the fourth hole transport compound in the fourth HTL 144 may each be lower by about 0.1 ev as compared with the LUMO energy level and HOMO energy level of the third hole transport compound in the third HTL 143. As a result, the second HTL 142 and the fourth HTL 144 may trap electrons, so that exiton quenching may be reduced.

The pyrimidine-based compound in the ETL 170 may have a LUMO energy level of from about $-2.4$ eV to about $-2.8$ eV, and a HOMO energy level of from about $-6.5$ eV to about $-6.0$ eV. When the LUMO energy level and HOMO energy level of the pyrimidine-based compound are within these ranges, the lifetime of the organic light-emitting device may be improved to a satisfactory level. The HOMO energy level of the ETL 170 may be lower than the HOMO energy level of the EML 160, and the LUMO energy level of the ETL 170 may be similar to the LUMO energy level of the EML 160. For example, the ETL 170 may have a HOMO energy level of about $-6.2$ eV.

Hereinafter, a structure of the organic light-emitting device 100, and a method of manufacturing the same, according to exemplary embodiments, will now be described with reference to FIG. 1.

The substrate 110, which may be any substrate that is used in general organic light-emitting devices, may be a glass substrate or a transparent plastic substrate with excellent mechanical strength, thermal stability, transparency, surface smoothness, ease of handling, and water resistance.

The first electrode 120 may be formed of a first electrode-forming material on the substrate by vacuum deposition or sputtering. When the first electrode 120 constitutes an anode, a material having a high work function may be used as the first electrode-forming material to facilitate hole injection. The first electrode 120 may be a reflective electrode or a transmission electrode. Transparent and conductive materials such as ITO, IZO, $SnO_2$, and ZnO may be used to form the first electrode 120. The first electrode 120 may be formed as a reflective electrode using magnesium (Mg), aluminum (Al), aluminum-lithium (Al—Li), calcium (Ca), magnesium-indium (Mg—In), magnesium-silver (Mg—Ag), or the like. The first electrode 120 may include two different materials. The first electrode 120 may have any of various structures, and in some embodiments, may have a double-layer structure including two different materials.

The multi-layered HTL 140 may be formed on the first electrode 120. The multi-layered HTL 140 may have a stacked structure of the first HTL 141, the second HTL 142, the third HTL 143, and the fourth HTL 144 that are sequentially stacked upon one another, e.g., directly on each other.

First, the first HTL 141 may be formed on the first electrode 120 by using any of a variety of methods, for example, vacuum deposition, a wet process, a laser transfer method, or the like. When the first HTL 141 is formed using vacuum deposition, vacuum deposition conditions may vary according to the compound that is used to form the HTL 140, and the desired structure and thermal properties of the HTL 140 to be formed. For example, vacuum deposition may be performed at a temperature of about 100° C. to about 500° C., a pressure of about $10^{-8}$ torr, to about $10^{-3}$ torr, and a deposition rate of about 0.01 to about 100 Å/sec. However, the deposition conditions are not limited thereto.

When the first HTL 141 is formed using a wet process such as spin coating, the coating conditions may vary according to the compound that is used to form the first HTL 141, and the desired structure and thermal properties of the first HTL 141 to be formed. For example, the coating rate may be in a range of from about 2000 rpm to about 5000 rpm, and a temperature at which heat treatment is performed to remove a solvent after coating may be in a range of about 80° C. to about 200° C. However, the coating conditions are not limited thereto. The first HTL 141 may be formed from a first hole transport compound doped with a first electron acceptor. An amount of the first electron acceptor may be from about 1 part to about 3 parts by weight based on 100 parts by of the first HTL 141. The first HTL 141 may have a thickness of from about 50 Å to about 400 Å. When the thickness of the first HTL 141 is within this range, the HTL 140 may have satisfactory hole transporting ability and generate an appropriate amount of charges without a substantial increase in driving voltage.

The second HTL 142 may be formed on the first HTL 141 by vacuum deposition, a wet process, or a laser transfer method. When the second HTL 142 is formed using vacuum deposition or spin coating, the conditions for deposition and coating are similar to those for the formation of the first HTL 141, though the conditions for the deposition and coating may vary according to the material that is used to form the second HTL 142. A material for forming the second HTL 142 may be the above-described second compound. The second HTL 142 may have a thickness of from about 200 Å to about 800 Å. When the thickness of the second HTL 142 is within these ranges, the second HTL 142 may have satisfactory hole transporting ability and satisfactory hole mobility without a substantial increase in driving voltage.

The third HTL 143 may be formed on the second HTL 142 by vacuum deposition, wet process, or a laser transfer method. When the third HTL 143 is formed using vacuum deposition or spin coating, the conditions for deposition and coating are similar to those for the formation of the HIL, though the conditions for the deposition and coating may vary according to the material that is used to form the third HTL 143. The third HTL 143 may be formed from a third hole transport compound doped with a second electron acceptor. The third hole transport compound may be the same material as the first hole transport compound. The second electron acceptor may be the same material as the first electron acceptor. An amount of the second electron acceptor may be from about 1 part to about 3 parts by weight based on 100 parts by weight of the third HTL 143. The third HTL 143 may have a thickness of from about 50 Å to about 400 Å. When the thickness of the third HTL 143 is within this range, the third HTL 143 may have satisfactory hole transporting ability and generate an appropriate amount of charges without a substantial increase in driving voltage.

The fourth HTL 144 may be formed on the third HTL 143 by vacuum deposition, wet process, or a laser transfer method. When the fourth HTL 144 is formed using vacuum deposition or spin coating, the conditions for deposition and coating are similar to those for the formation of the first HTL 141, though the conditions for the deposition and coating may vary according to the material that is used to form the fourth HTL 144. A material for forming the fourth HTL 144 may be the fourth hole transport compound. A material for forming the fourth hole transport compound may be the same material as a second hole transport compound. A thickness of the fourth HTL 144 may be in a range of about 200 to about 800 Å. When the thickness of the fourth HTL 144 is within this range, the fourth HTL 144 may have satisfactory hole transporting ability without a substantial increase in driving voltage.

The buffer layer 150 may be formed on the fourth HTL 144. When the buffer layer 150 is formed using vacuum deposition or spin coating, the conditions for deposition and coating are similar to those for the formation of the first HTL 141, though the conditions for the deposition and coating may vary according to the material that is used to form the buffer layer 150. The buffer layer 150 may be formed using a first hole transport compound.

The buffer layer 150 may have a thickness of about 100 Å to about 800 Å. When the thickness of the buffer layer 150 is within this range, no excessive increase in driving voltage may occur, and an optical resonance distance may be compensated for according to the wavelength of light emitted from the EML 160, so that the organic light-emitting device may have improved efficiency.

The EML 160 may be formed on the buffer layer 150. When the EML 150 is formed using vacuum deposition or spin coating, the deposition and coating conditions may be similar to those for the formation of the first HTL 141, though the conditions for deposition and coating may vary according to the material that is used to form the EML 160.

The emission layer 160 may be formed using a phosphorescent host, a fluorescent host, or a phosphorescent or fluorescent dopant. Non-limiting examples of suitable known hosts are 4,4'-N,N'-dicarbazole-biphenyl (CPB), 9,10-dinaphthalene-2-yl-anthracene (ADN, see Formula below), TPBI (see Formula below), TBADN (see Formula below), and E3 (see Formula below).

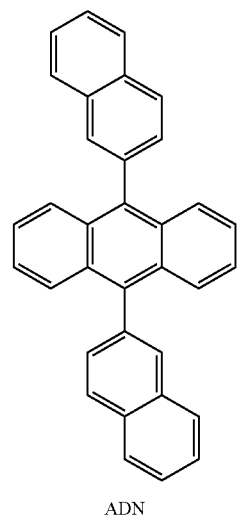

ADN

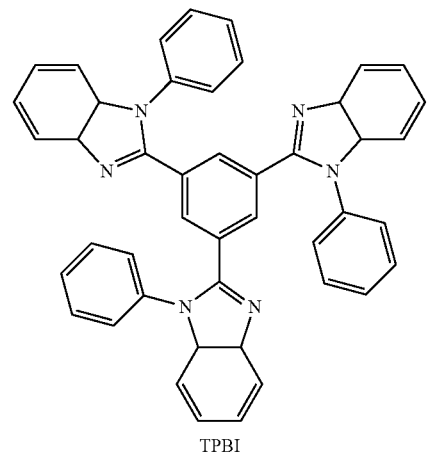

TPBI

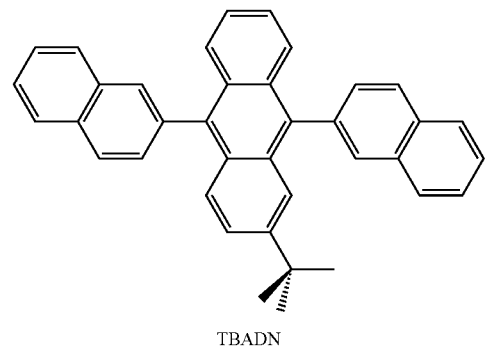

TBADN

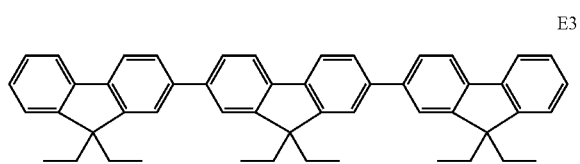 [SMILES: CCC1(CC)c2ccccc2-c2ccc(-c3ccc4c(c3)C(CC)(CC)c3cc(-c5ccc6c(c5)C(CC)(CC)c5ccccc5-6)ccc3-4)cc21]

Non-limiting examples of suitable red dopants are PtOEP (see Formula below), Ir(piq)$_3$ (see Formula below), and Btp$_2$Ir(acac) (see Formula below).

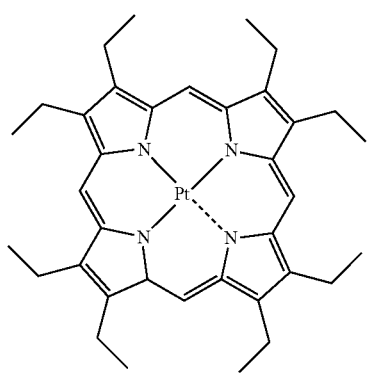

PtOEP

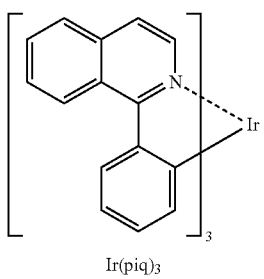

Ir(piq)$_3$

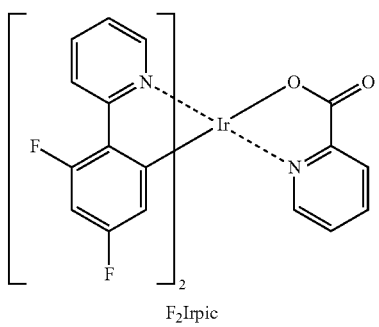

F$_2$Irpic

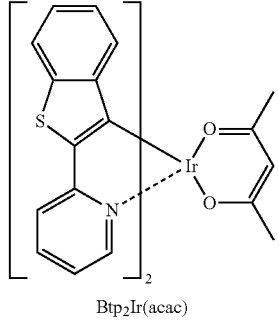

Btp$_2$Ir(acac)

Non-limiting examples of suitable green dopants are Ir(ppy)$_3$ (ppy=phenylpyridine, see Formula below), Ir(ppy)$_2$(acac) (see Formula below), and Ir(mpyp)$_3$ (see Formula below).

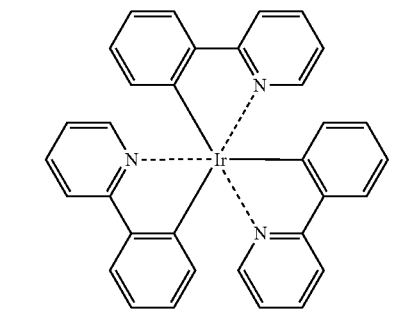

Ir(ppy)$_3$

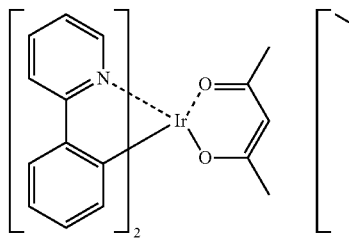

Ir(ppy)$_2$(acac)

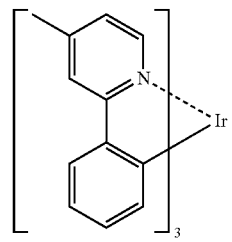

Ir(mpyp)$_3$

Non-limiting examples of suitable blue dopants are F$_2$Irpic (see Formula below), (F$_2$ppy)$_2$Ir(tmd) (see Formula below), Ir(dfppz)$_3$ (see Formula below), DPVBi (see Formula below), 4,4'-bis(4-diphenylaminostyryl)biphenyl (DPAVBi, see Formula below), and 2,5,8,11-tetra-tert-butyl pherylene (TBPe, see Formula below).

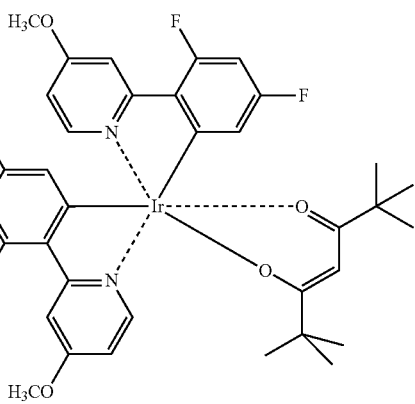

(F$_2$ppy)$_2$Ir(tmd)

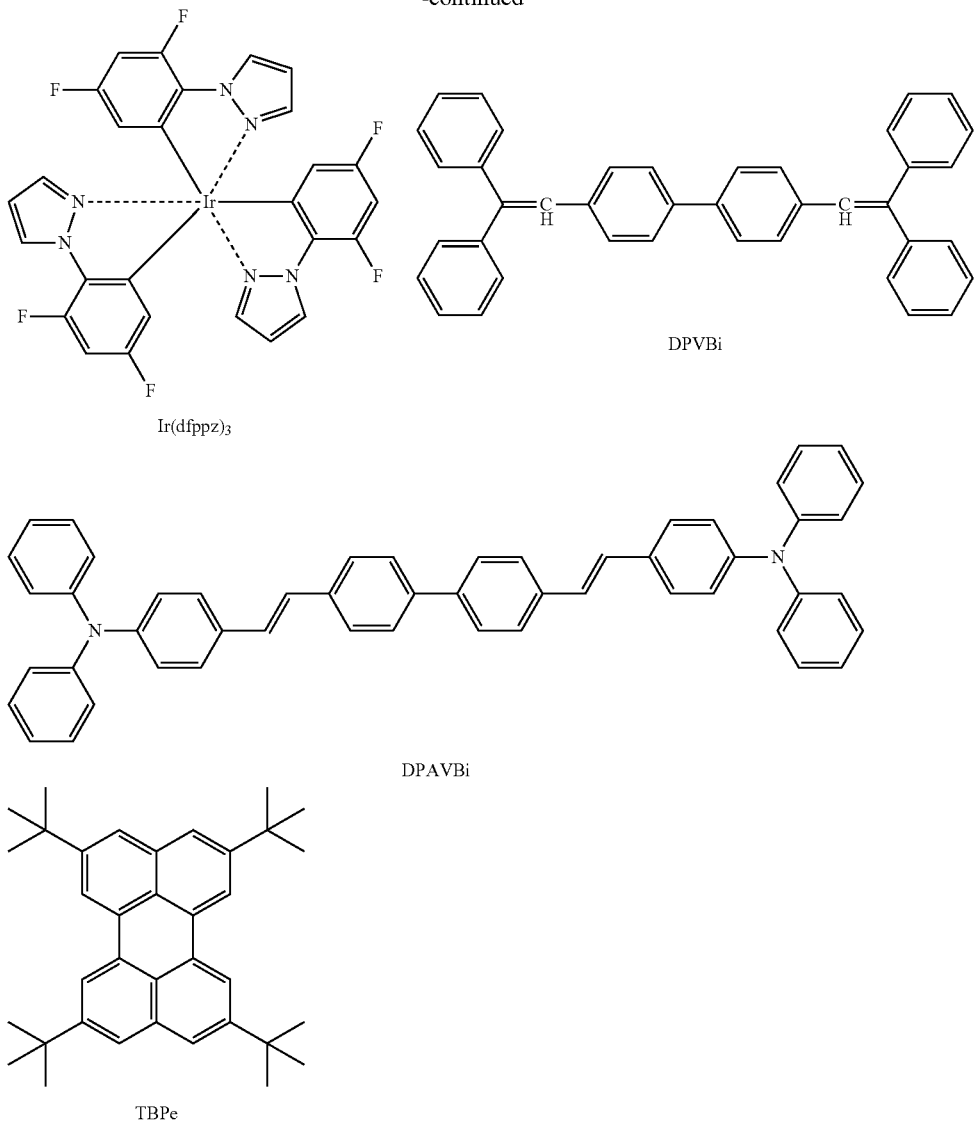

When the EML 160 includes both a host and a dopant, the amount of the dopant may be from about 0.01 parts to about 15 parts by weight based on 100 parts by weight of the host. However, the amount of the dopant is not limited to this range.

A thickness of the EML 160 may be from about 100 Å to about 1000 Å, and in some embodiments, may be from about 100 Å to about 600 Å. When the thickness of the EML 160 is within these ranges, the EML 160 may have improved light emitting ability without a substantial increase in driving voltage.

However, when the EML 160 is formed using a phosphorescent dopant, to reduce the possibility of and/or prevent diffusion of triplet excitons or holes toward the ETL 170, a hole blocking layer (not shown) may be formed between the HTL 170 and the EML 160 by a method, for example, vacuum deposition, a wet process, laser transfer, or the like.

When the HBL is formed using vacuum deposition or spin coating, the deposition and coating conditions may be similar to those for the formation of the HIL, though the conditions for deposition and coating may vary according to the material that is used to form the HBL. For example, the HBL may be formed using an oxadiazole derivative, a triazole derivative, or a phenanthroline derivative. A thickness of the HBL may be in a range of from about 50 Å to about 1000 Å, and in some embodiments, may be from about 100 Å to about 300 Å. When the thickness of the HBL is within these ranges, the HBL may have improved hole blocking ability without a substantial increase in driving voltage.

Then, the ETL 170 may be formed on the EML 160 or HBL using any of a variety of methods, for example, vacuum deposition, a wet process, or a laser transfer method. The ETL 10 may be formed using only one pyrimidine-based compound. The pyrimidine-based compound may be a compound represented by Formula 3 above. A thickness of the ETL 170 may be in a range of about 100 Å to about 1,000 Å, and in some embodiments, may be from about 150 Å to about 500 Å. When the thickness of the ETL 170 is within these ranges, the ETL 170 may have satisfactory electron transport ability without a substantial increase in driving voltage. When the ETL 170 is formed using vacuum deposition or spin coating, the deposition and coating conditions may be similar to those for the formation of the first HTL 141, though the deposition and coating conditions may vary according to the material that is used to form the ETL 170.

An electron injection layer (EIL, not shown) that facilitates the injection of electrons from the cathode may be formed on the ETL 170. Non-limiting examples of an EIL-forming material are LiQ, LiF, and Compound 101 above. The deposition and coating conditions for forming the EIL may be similar to those for the formation of the first HTL 141, though the deposition and coating conditions may vary according to a material that is used to form the EIL. A thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode 190 may be disposed on the EIL. The second electrode 190 may be a cathode, which is an electron injecting electrode. A metal for forming the second electrode 190 may be a metal, an alloy, or an electrically conductive compound that have a low-work function, or a mixture thereof. In some embodiments, the second electrode 190 as a transmission electrode may be formed using a thin film of Li, Mg, Al, Al—Li, Ca, Mg—In, Mg—Ag, or the like. In some embodiments, to manufacture a top-emission light-emitting device, the transmission electrode may be formed of indium tin oxide (ITO) or indium zinc oxide (IZO).

Although the method of manufacturing an organic light-emitting device according to exemplary embodiments is described above with reference to FIG. 1, embodiments are not limited to the organic light-emitting device with the structure of FIG. 1.

The organic light-emitting device may be included in an organic light-emitting display apparatus including a transistor.

According to an exemplary embodiment, an organic light-emitting display apparatus includes a transistor with a source, a drain, a gate, and an active layer; and the above-described organic light-emitting device including the multi-layered HTL, whereas one of the source and the drain of the transistor is electrically connected to the first electrode of the organic light-emitting device.

The active layer of the transistor may be in any of a variety of forms, for example, as an amorphous silicon layer, a crystalline silicon layer, an organic semiconductor layer, or an oxide semiconductor layer.

As used herein, examples of the "unsubstituted $C_1$-$C_{30}$ alkyl group" (or "$C_1$-$C_{30}$alkyl group") are C1-C30 linear of branched alkyl groups, such as methyl, ethyl, propyl, isobutyl, sec-butyl, pentyl, iso-amyl, and hexyl. Examples of the substituted $C_1$-$C_{30}$ alkyl groups are the unsubstituted $C_1$-$C_{30}$ alkyl group of which at least one hydrogen atom is substituted with one of a deuterium atom, a halogen atom, a hydroxyl group, a cyano group, an amino group, a nitro group, an amidino group, hydrazine, hydrazone, a carboxyl group or a salt thereof, sulfonic acid or a salt thereof, phosphoric acid or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_6$-$C_{30}$ aryl group, an unsubstituted $C_6$-$C_{30}$ aryloxy group, a $C_6$-$C_{30}$ arylthio group, a $C_2$-$C_{30}$ heteroaryl group, —N($Q_{101}$)($Q_{102}$), and —Si($Q_{103}$)($Q_{104}$)($Q_{105}$)($Q_{106}$) (wherein $Q_{101}$ to $Q_{106}$ are each independently one of a hydrogen atom, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_6$-$C_{30}$ aryl group, and $C_2$-$C_{30}$ heteroaryl group).

As used herein, the unsubstituted $C_2$-$C_{30}$ alkenyl group (or $C_2$-$C_{30}$alkenyl group) is a hydrocarbon chain having a carbon-carbon double bond in the center or at a terminal of the unsubstituted $C_2$-$C_{30}$ alkyl group. Examples of the unsubstituted $C_2$-$C_{30}$ alkenyl group are ethenyl, propenyl, and butenyl groups. At least one hydrogen atom in the unsubstituted $C_2$-$C_{30}$ alkenyl group may be substituted with the substituents described in conjunction with the substituted $C_1$-$C_{30}$ alkyl group.

As used herein, the unsubstituted $C_2$-$C_{30}$ alkynyl group (or $C_2$-$C_{30}$alkynyl group) is an alkyl group having at least one carbon-carbon triple bond in the center or at a terminal of the $C_2$-$C_{30}$ alkyl group. Examples of the unsubstituted $C_2$-$C_{30}$ alkynyl group are ethynyl and propynyl. The substituted $C_2$-$C_{30}$ alkynyl groups are substituted $C_2$-$C_{30}$ alkynyl groups of which at least one hydrogen atom is substituted with substituents as those described in connection with substituted $C_1$-$C_{30}$ alkyl group unsubstituted $C_2$-$C_{30}$ alkynyl group.

As used herein, the unsubstituted $C_1$-$C_{30}$ alkoxy group (or a $C_1$-$C_{30}$ alkoxy group) may be represented by the formula of —OA (wherein A is a unsubstituted $C_1$-$C_{30}$ alkyl group as described above, and non-limiting examples thereof are methoxy, ethoxy, and isopropyloxy. The substituted $C_1$-$C_{30}$ alkoxy group may be a $C_1$-$C_{30}$ alkyl group of which at least one hydrogen atom is substituted with the same substituents as described in connection with the substituted $C_1$-$C_{30}$ alkyl group.

As used herein, the unsubstituted $C_3$-$C_{30}$ cycloalkyl group (or $C_3$-$C_{30}$ cycloalkyl group) may be a saturated $C_3$-$C_{30}$ monocyclic, bicyclic, or tricyclic non-aromatic hydrocarbon group. Non-limiting examples thereof are cyclopropyl, cyclobutyl, cyclopentyl, cyclohexyl, cycloheptyl, cyclooctyl, and decahydronaphthalenyl. The substituted $C_3$-$C_{30}$ cycloalkyl group may be a $C_3$-$C_{30}$ cycloalkyl group of which at least one hydrogen atom is substituted with the same substituents as described in connection with the substituted $C_1$-$C_{30}$ alkyl group.

As used herein, the unsubstituted $C_3$-$C_{30}$ cycloalkenyl group (or $C_3$-$C_{30}$ cycloalkenyl group may be an unsaturated $C_3$-$C_{30}$ monocyclic, bicyclic, or tricyclic non-aromatic hydrocarbon group. Non-limiting examples thereof are cyclopentenyl, and cyclohexenyl. The substituted $C_3$-$C_{30}$ cycloalkenyl group may be a $C_3$-$C_{30}$ cycloalkenyl group of which at least one hydrogen atom is substituted with the same substituents as described in connection with the substituted $C_1$-$C_{30}$ alkyl group.

The unsubstituted $C_6$-$C_{30}$ aryl group is a monovalent group having a carbocyclic aromatic system having 6 to 30 carbon atoms including at least one aromatic ring. The unsubstituted $C_6$-$C_{30}$ arylene group is a bivalent group having a carbocyclic aromatic system having 6 to 30 carbon atoms including at least one aromatic ring. When the aryl group and the arylene group have at least two rings, they may be fused to each other via a single bond. The substituted $C_6$-$C_{30}$ aryl group is a $C_6$-$C_{30}$ aryl group of which at least one hydrogen atom is substituted with the same substituents as described in connection with the substituted $C_1$-$C_{30}$ alkyl group. The substituted $C_6$-$C_{30}$ arylene group is a $C_6$-$C_{30}$ arylene group of which at least one hydrogen atom is substituted as the same substituents as described in connection with the substituted $C_1$-$C_{30}$ alkyl group.

As used herein, the unsubstituted $C_6$-$C_{30}$ aryloxy group is represented by —OA$_2$ (wherein A$_2$ is a substituted or unsubstituted $C_6$-$C_{30}$ aryl group). The substituted $C_6$-$C_{30}$ aryloxy group is a $C_6$-$C_{30}$ aryloxy group of which at least one hydrogen atom is substituted with the same substituents as described in connection with the substituted $C_1$-$C_{30}$ alkyl group.

As used herein, the unsubstituted $C_6$-$C_{30}$ arylthio group is represented by —$SA_3$ (wherein $A_3$ is a substituted or unsubstituted $C_3$-$C_{30}$ aryl group). The substituted $C_6$-$C_{30}$ arylthio group is a $C_6$-$C_{30}$ arylthio group of which at least one hydrogen atom is substituted with the same substituents as described in connection with the substituted $C_1$-$C_{30}$ alkyl group.

As used herein, the unsubstituted $C_2$-$C_{30}$ heteroaryl group is a monovalent group having at least one aromatic ring with at least one carbon atom and at least one non-carbon heteroatom (for example, selected from the group of N, O, P, and S). The unsubstituted $C_2$-$C_{30}$ heteroarylene group is a bivalent group having at least one aromatic ring with at least one carbon atom and at least one non-carbon heteroatom (for example, selected from the group of N, O, P, and S). In this regard, when the heteroaryl group and the heteroarylene group have at least two rings, they may be fused to each other via a single bond. The substituted $C_2$-$C_{30}$ heteroaryl group is a $C_2$-$C_{30}$ heteroaryl group of which at least one hydrogen atom is substituted with the same substituents as described in connection with the substituted $C_1$-$C_{30}$ alkyl group. The substituted $C_2$-$C_{30}$ heteroarylene group is a $C_2$-$C_{30}$ heteroarylene group of which at least one hydrogen atom is substituted as the same substituents as described in connection with the substituted $C_1$-$C_{30}$ alkyl group.

As used herein, the substituted phenyl group, the substituted naphthyl group, the substituted anthryl group, the substituted biphenyl group, or the substituted pyridyl group may be a phenyl group, a naphthyl group, a anthryl group, a biphenyl group, or a pyridyl group of which at least one hydrogen atom is substituted with one of a deuterium atom, a halogen atom, a hydroxyl group, a cyano group, an amino group, a nitro group, an amidino group, hydrazine, hydrazone, a carboxyl group or a salt thereof, sulfonic acid or a salt thereof, phosphoric acid or a salt thereof, a $C_1$-$C_{30}$ alkyl group, a $C_2$-$C_{30}$ alkenyl group, a $C_2$-$C_{30}$ alkynyl group, a $C_1$-$C_{30}$ alkoxy group, a $C_3$-$C_{30}$ cycloalkyl group, a $C_3$-$C_{30}$ cycloalkenyl group, a $C_6$-$C_{30}$ aryl group, an unsubstituted $C_6$-$C_{30}$aryloxy group, a $C_6$-$C_{30}$arylthio group, a $C_2$-$C_{30}$ heteroaryl group, —$N(Q_{101})(Q_{102})$, and —$Si(Q_{103})(Q_{104})(Q_{105})(Q_{106})$ (wherein $Q_{101}$ to $Q_{106}$ are each independently one of a hydrogen atom, a $C_1$-$C_{30}$ alkyl group, a $C_2$-$C_{30}$ alkenyl group, a $C_2$-$C_{30}$alkynyl group, a $C_1$-$C_{30}$ alkoxy group, a $C_6$-$C_{30}$ aryl group, and a $C_2$-$C_{30}$ heteroaryl group).

Hereinafter, exemplary embodiments will be described in detail with reference to the following synthesis examples. In this regard, Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the embodiments as exemplified in the Examples or as necessarily being outside the scope of the invention in every respect.

Example 1

Device Structure=ITO/Compound 301: Compound 501/Compound 35/Compound 301: Compound 501/Compound 35/Compound 301/EML/Compound 701/LiF/Al To manufacture an anode, a corning 15 $\Omega/cm^2$ (1200 Å) ITO glass substrate was cut to a size of 50 mm×50 mm×0.7 mm and then sonicated in isopropyl alcohol and pure water each for five minutes, and then cleaned by irradiation of ultraviolet (UV) rays for 30 minutes and exposure to ozone. The resulting glass substrate was loaded into a vacuum deposition device.

Compound 301 and Compound 501 were vacuum co-deposited on a surface of ITO glass to form a first HTL having a thickness of about 100 Å thickness, and then Compound 35 was vacuum deposited on the first HTL to form a second HTL layer having a thickness of about 400 Å. Next, Compound 301 and Compound 501 were vacuum co-deposited on the second HTL in a weight ratio of about 98:2 to form a third HTL having a thickness of about 200 Å, and then Compound 35 was vacuum-deposited on the third HTL layer to form a fourth HTL having a thickness of about 400 Å.

Compound 301 was vacuum-deposited on the fourth HTL to form a buffer layer having a thickness of about 230 Å.

ADN and DPVBi were co-deposited on the buffer layer in a weight ratio of about 98:2 to form an EML having a thickness of about 200 Å. Compound 701 was vacuum-deposited on the EML to form an ETL having a thickness of about 300 Å.

LiF was vacuum-deposited on the ETL to form the EIL having a thickness of 10 Å and Al was vacuum-deposited on the EIL to form a LiF/Al electrode having a thickness of 3000 Å, thereby completing the manufacture of an organic light-emitting device.

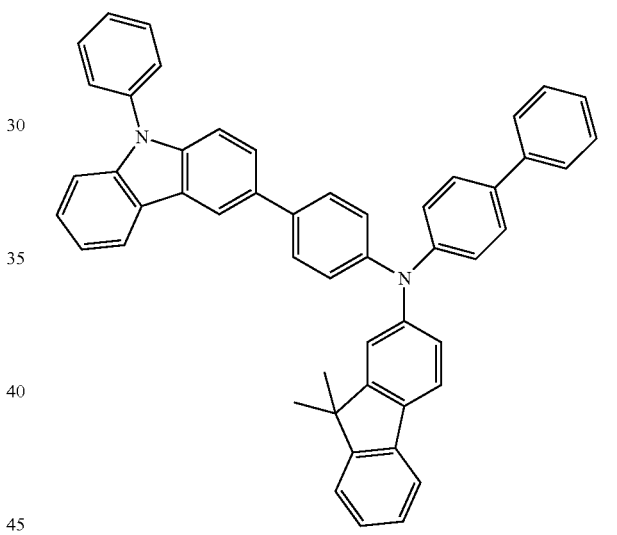

301

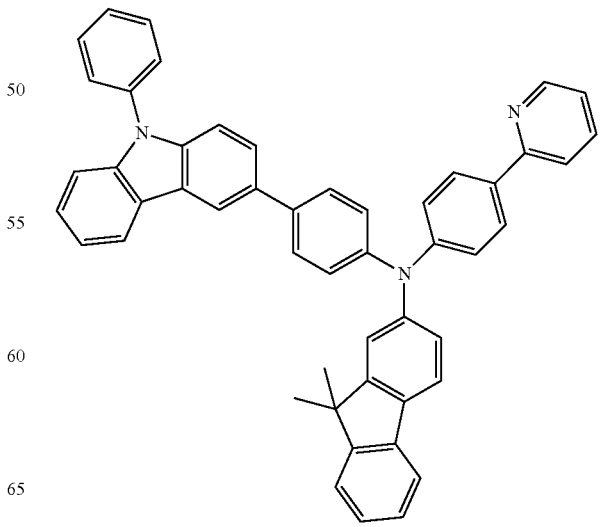

35

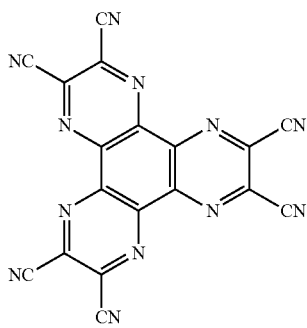

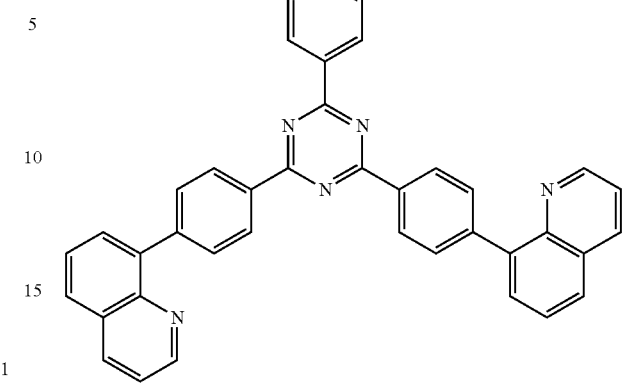

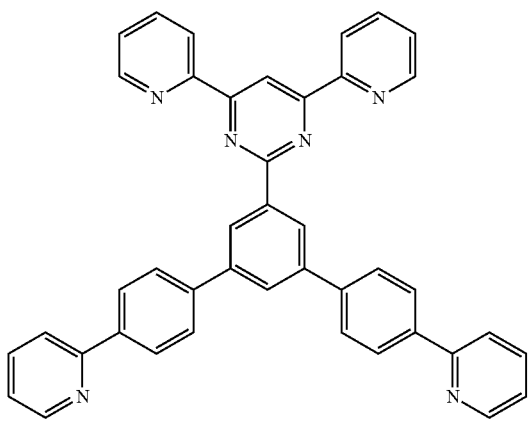

Comparative Example 1

Device Structure=ITO/Compound 301: Compound 501/Compound 35/Compound 301: Compound 501/Compound 35/Compound 301/EML/Compound 801/LiF/Al An organic light-emitting device was manufactured in the same manner as in Example 1, except that Compound 801, instead of Compound 701, was used to form an ETL having a thickness of about 300 Å on the EML by vacuum deposition.

Comparative Example 2

Device Structure=ITO/2-TNATA:F4-TCNQ/2-TNATA/EML/Compound 701/LiF/Al

An organic light-emitting device was manufactured in the same manner as in Example 1, except that 2-TNATA and F4-TCNQ were vacuum-codeposited on the EML in a weight ratio of about 98:2 to form a p-doped layer having a thickness of about 100 Å, and 2-TNATA was vacuum-deposited on the p-doped layer to form a HTL having a thickness of about 400 Å.

Evaluation Example

Driving voltage, luminescent efficiency, CIE (x, y) color coordinates, and lifetime (at a 400-nit luminance) of the organic light-emitting devices of Example 1 and Comparative Examples 1 and 2 were measured using a PR650 (Spectroscan) source measurement unit (available from PhotoResearch, Inc.). The results are shown in Table 1 below.

TABLE 1

| Example | Driving voltage (V) | Current density (mA/cm$^2$) | Current efficiency (cd/A) | Power efficiency (lm/W) | CIE_x | CIE_y | Efficiency/y |
|---|---|---|---|---|---|---|---|
| Example 1 | 4.7 | 16.7 | 3.9 | 2.6 | 0.139 | 0.050 | 78.4 |
| Comparative Example 1 | 4.7 | 17.6 | 3.1 | 2.1 | 0.143 | 0.042 | 74.1 |
| Comparative Example 2 | 4.7 | 17.6 | 3.1 | 2.1 | 0.143 | 0.042 | 74.1 |

Referring to Table 1, the organic light-emitting device of Example 1 is found to have similar light-emitting characteristics to the organic light-emitting devices of Comparative Examples 1 and 2. In particular, the organic light-emitting device of Example 1 is found to have about a 10% difference in driving voltage and conversion efficiency in comparison with the organic light-emitting devices of Comparative Examples 1 and 2.

Figure 3:
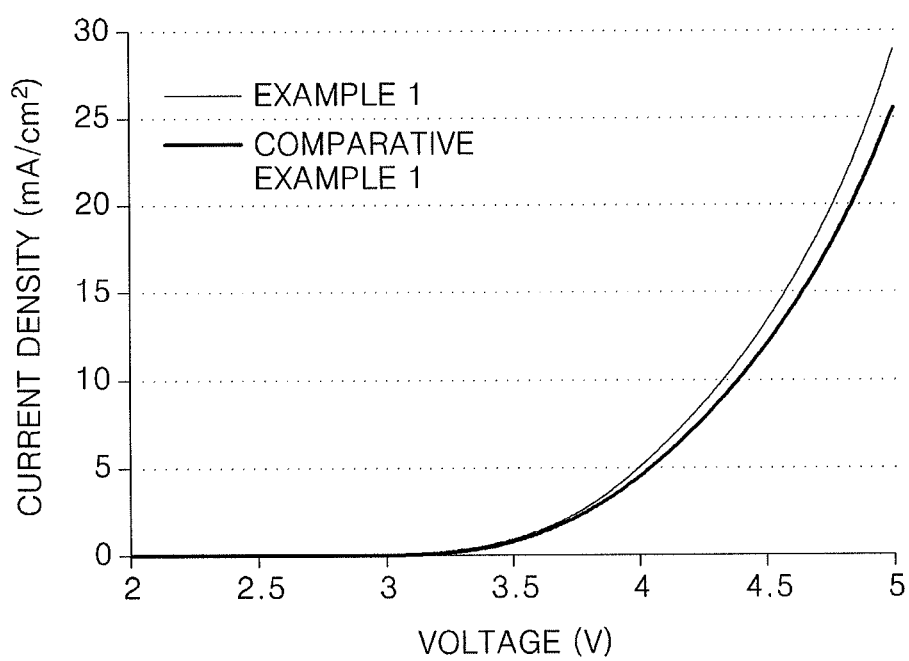
FIG. 3 is a graph of current density with respect to driving voltage in organic light-emitting devices manufactured according to Example 1 and Comparative Example 1.

FIG. 3 is a graph of current density with respect to driving voltage in organic light-emitting devices according to Example 1 and Comparative Example 1. Referring to FIG. 3, a driving voltage versus current density relationship in the organic light-emitting device of Example 1 is found to be similar to that of the organic light-emitting device of Comparative Example 1 without any significant difference.

Figure 4:
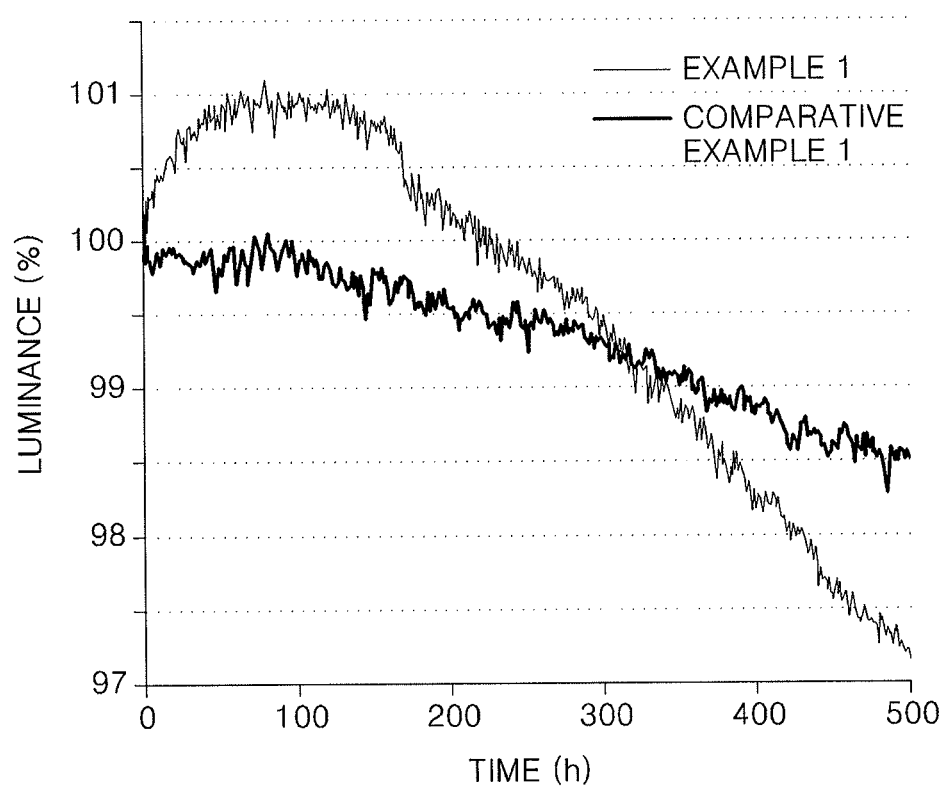
FIG. 4 is a graph illustrating lifetime characteristics of the organic light-emitting devices of Example 1 and Comparative Example 1.

FIG. 4 is a graph illustrating lifetime characteristics of the organic light-emitting devices of Example 1 and Comparative Example 1.

Referring to FIG. 4, the organic light-emitting device of Example 1 is found to have a better lifetime curve pattern as compared with the organic light-emitting device of Comparative Example 1. In particular, at 97% of the organic light-emitting device of Example 1, i.e., the time it takes until 97% of an initial luminance is reached, is found to be over 500 hours (about 700 hours or longer), indicating that the organic light-emitting device of Example 1 has a very longer lifetime as compared with the organic light-emitting device of Comparative Example 1 having a 97% of about 500 hours.

By way of summation and review, an organic light emitting device may have a structure including an anode disposed on a substrate, a hole transport layer (HTL), an emission layer (EML), an electron transport layer (ETL) and a cathode that are sequentially arranged upon one another. The HTL, the EML, and the ETL may be organic thin films formed of organic compounds.

An operating principle of the organic light emitting device having the above-described stacked structure includes a voltage being applied between the anode and the cathode, holes injected from the anode moving to the EML via the HTL, and electrons injected from the cathode moving to the EML via the ETL. The holes and electrons (carriers) recombine in the EML to generate excitons. When the excitons drop from an excited state to a ground state, light is emitted.

A hole transport material used in HTL may have a high ability to inject and transport holes, and thus may reduce a driving voltage of a device. However, although using a hole transport material with such high hole mobility may remarkably reduce a driving voltage of a device, the device may have significantly low efficiency and lifetime. Accordingly, there have been efforts to form a HIL using a p-type doping material between the anode and the EML and to form a hole transport layer using a hole transport material on the EML.

This method may reduce the driving voltage of the organic light-emitting device. However, the use of such a high-conductivity hole transport material may lead to injection of excessive charges, and thus a reduced lifetime of the organic light emitting device. Further, light emission may occur near an interface between the HTL and the EML, leading to an increased non-radiative quenching, which may also reduce the efficiency and lifetime of the organic light emitting device.

In contrast, embodiments relate to an organic light-emitting device with a low driving voltage, and high efficiency and lifetime characteristics. Embodiments also relate to an organic light-emitting device and display apparatus that include a multi-layered hole transport layer, which is obtained using hole transport compounds having different energy levels doped with electron acceptors. For example, due to balanced injection and flow between holes and electrons, the organic light-emitting device including the multi-layered hole transport layer, which is obtained using hole transport compounds having different energy levels doped with electron acceptors, may have a low driving voltage, and improved light-emission efficiency and lifetime characteristics.

Embodiments further relate to an organic light-emitting device with a multi-layered HTL doped with electron acceptors, which have improved charge balance, improved stability, and improved luminescent efficiency and lifetime. Since an ETL of the organic light-emitting device is formed from a pyrimidine-based compound, co-deposition is not necessary, so that a manufacturing process of the organic light-emitting device may be simplified. Further, the ETL formed from the pyrimidine-based compound may have a low carrier mobility, and thus lifetime of the organic light-emitting device may be improved.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An organic light-emitting device, comprising:

a substrate;

a first electrode on the substrate;

a second electrode opposing the first electrode;

an emission layer between the first electrode and the second electrode;

a first hole transport layer between the emission layer and the first electrode, the first hole transport layer including a first hole transport compound and a first electron acceptor;

a second hole transport layer between the emission layer and first hole transport layer, the second hole transport layer including a second hole transport compound;

a third hole transport layer between the emission layer and the second hole transport layer, the third hole transport layer including a third hole transport compound and a second electron acceptor;

a fourth hole transport layer between the emission layer and the third hole transport layer, the fourth hole transport layer including a fourth hole transport compound;

a buffer layer between the emission layer and the fourth hole transport layer; and an electron transport layer between the emission layer and the second electrode, the electron transport layer including a pyrimidine-based compound, wherein the first hole transport compound and the third hole transport compound each independently include a compound represented by Formula 1, and the second hole transport compound and the fourth hole transport compound each independently include a compound represented by Formula 2:

Formula 1

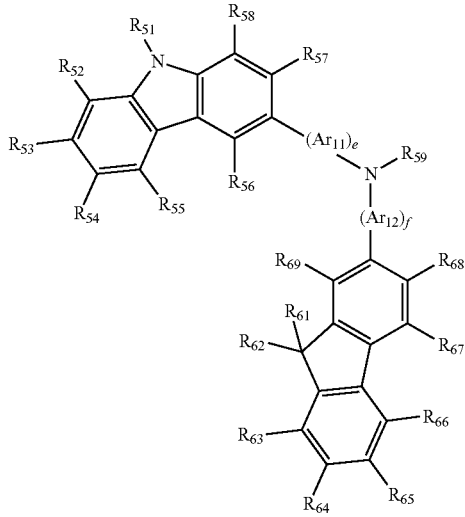

wherein, in Formula 1,
Ar$_{11}$ and Ar$_{12}$ are each independently a substituted or unsubstituted C$_6$-C$_{30}$ arylene group;
e and f are each independently an integer from 0 to 5;
R$_{51}$ to R$_{58}$ and R$_{61}$ to R$_{69}$ are each independently a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_1$-C$_{30}$ alkoxy group, a substituted or unsubstituted C$_3$-C$_{30}$ cycloalkyl group, a substituted or unsubstituted C$_6$-C$_{30}$ aryl group, a substituted or unsubstituted C$_6$-C$_{30}$ aryloxy group, or a substituted or unsubstituted C$_6$-C$_{30}$ arylthio group; and
R$_{59}$ is a substituted or unsubstituted phenyl group, a substituted or unsubstituted naphthyl group, a substituted or unsubstituted anthryl group, a substituted or unsubstituted biphenyl group, or a substituted or unsubstituted pyridyl group, Formula 2

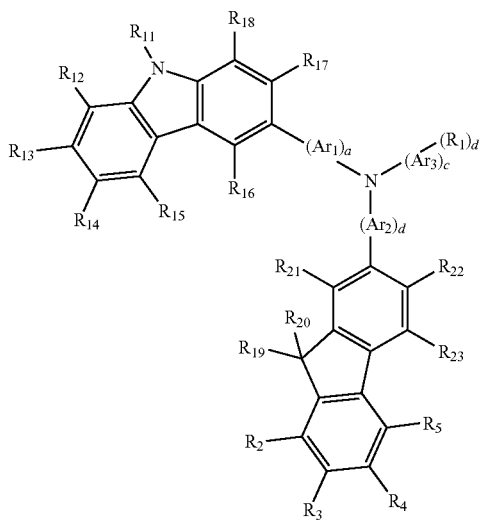

wherein, in Formula 2,
Ar$_1$ to Ar$_3$ are each independently a substituted or unsubstituted C$_6$-C$_{30}$ arylene group;
a and b are each independently an integer from 0 to 5;
c is an integer from 1 to 5;
R$_1$ to R$_5$ are each independently a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_1$-C$_{30}$ alkoxy group, a substituted or unsubstituted C$_3$-C$_{30}$ cycloalkyl group, a substituted or unsubstituted C$_6$-C$_{30}$ aryl group, a substituted or unsubstituted C$_6$-C$_{30}$ aryloxy group, a substituted or unsubstituted C$_6$-C$_{30}$ arylthio group, —Si(R$_{31}$)(R$_{32}$)(R$_{33}$), —N(R$_{34}$)(R$_{35}$), or a nitrogen atom-containing group, wherein at least one of R$_1$ to R$_5$ is a nitrogen atom-containing group;

d is an integer from 0 to 5;

R$_{11}$ to R$_{23}$ are each independently a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_1$-C$_{30}$ alkoxy group, a substituted or unsubstituted C$_3$-C$_{30}$ cycloalkyl group, a substituted or unsubstituted C$_6$-C$_{30}$ aryl group, a substituted or unsubstituted C$_6$-C$_{30}$ aryloxy group, a substituted or unsubstituted C$_6$-C$_{30}$ arylthio group, —Si(R$_{36}$)(R$_{37}$)(R$_{38}$), or —N(R$_{39}$)(R$_{40}$);

wherein, R$_{31}$ to R$_{40}$ are each independently a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted C$_1$-C$_{30}$ alkyl group, a substituted or unsubstituted C$_2$-C$_{30}$ alkenyl group, a substituted or unsubstituted C$_2$-C$_{30}$ alkynyl group, a substituted or unsubstituted C$_1$-C$_{30}$ alkoxy group, a substituted or unsubstituted C$_3$-C$_{30}$ cycloalkyl group, a substituted or unsubstituted C$_6$-C$_{30}$ aryl group, a substituted or unsubstituted C$_6$-C$_{30}$ aryloxy group, a substituted or unsubstituted C$_6$-C$_{30}$ arylthio group, or a substituted or unsubstituted C$_2$-C$_{30}$ heteroaryl group; and the nitrogen atom-containing group is a ring group with at least one nitrogen as a ring atom selected from among a 5-membered aromatic ring group, a 6-membered aromatic ring group, and a 9-membered aromatic ring group fused from 5-membered and 6-membered aromatic groups.

2. The organic light-emitting device of claim 1, wherein the first hole transport compound and the third hole transport compound each independently include a compound represented by Formula 1A:

Formula 1A

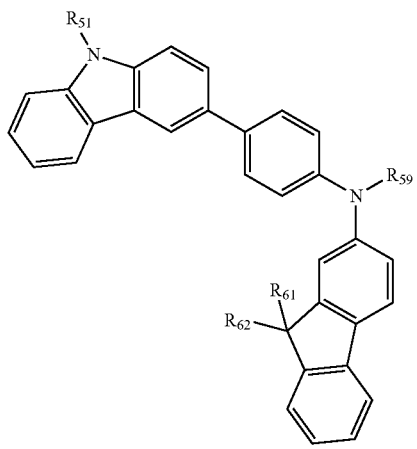

wherein, in Formula 1A, $R_{51}$, $R_{59}$, $R_{61}$, and $R_{62}$ are as defined in Formula 1.

3. The organic light-emitting device of claim 1, wherein the first hole transport compound and the third hole transport compound each independently include a compound 301 below:

Compound 301

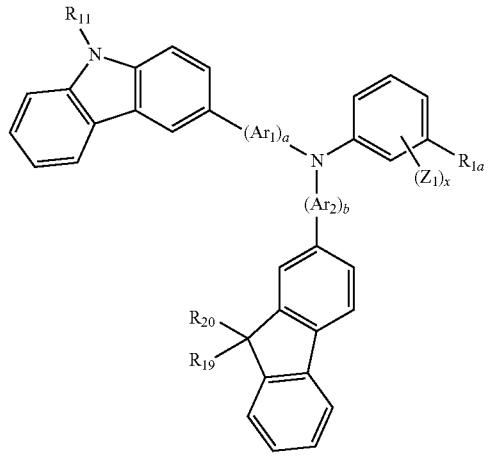

4. The organic light-emitting device of claim 1, wherein the second hole transport compound and the fourth hole transport compound each independently include at least one of compounds represented by Formulae 2A to 2K:

Formula 2A

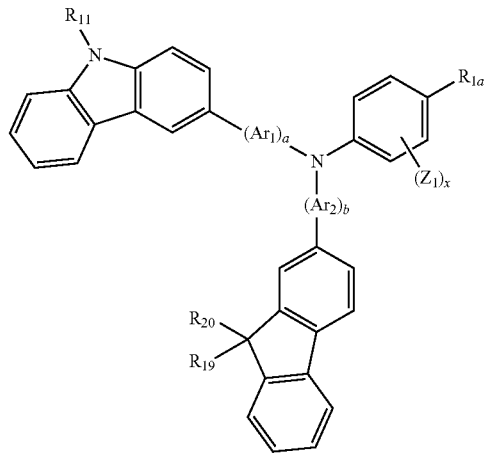

Formula 2B

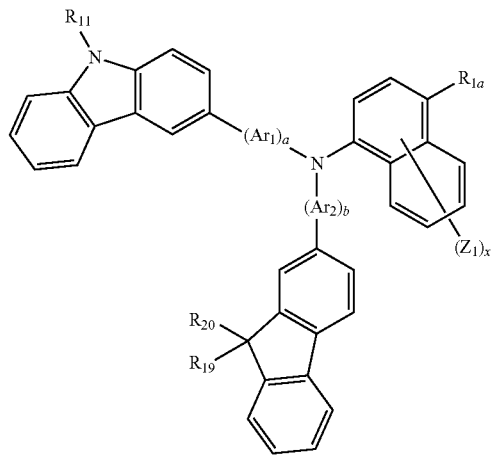

Formula 2C

Formula 2D
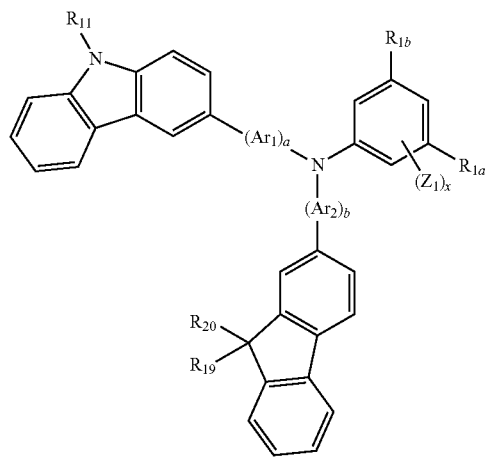
Formula 2E
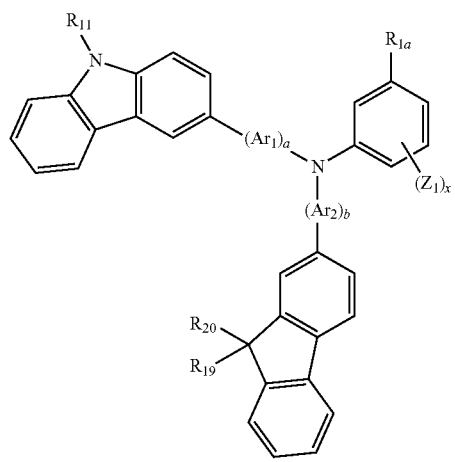
Formula 2F
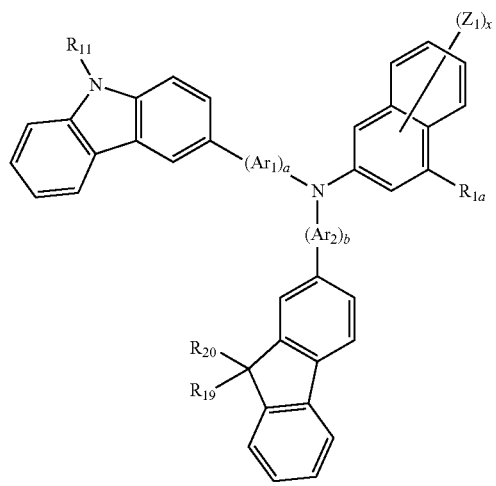
Formula 2G
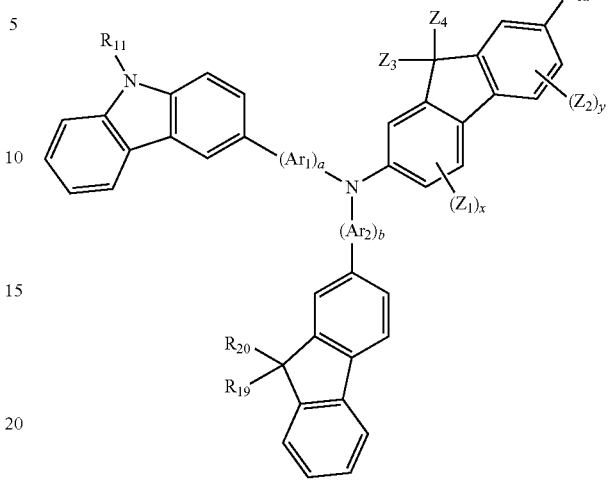
Formula 2H
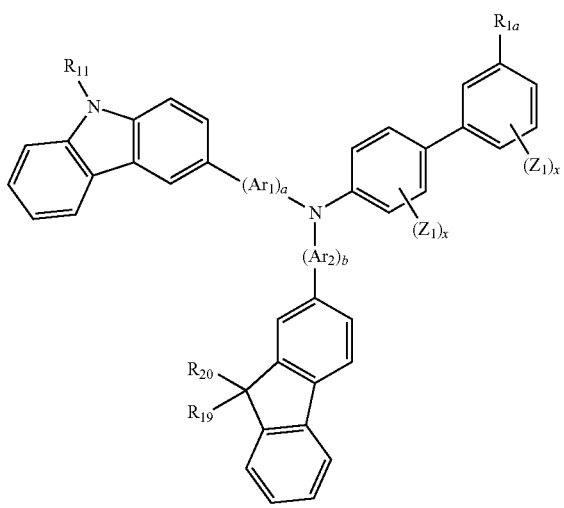
Formula 2I
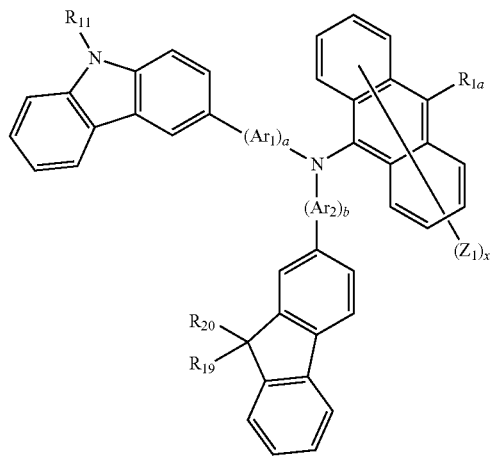

-continued

Formula 2J

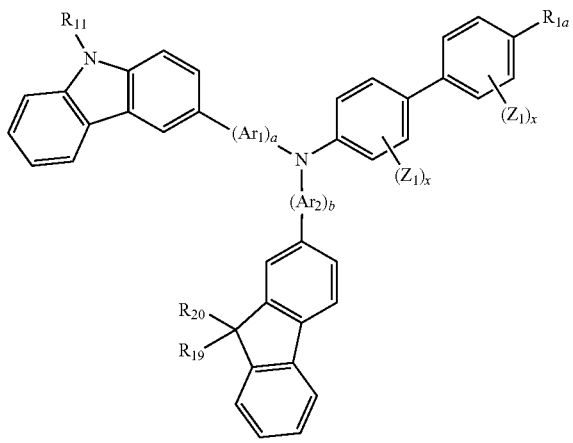

Formula 2K

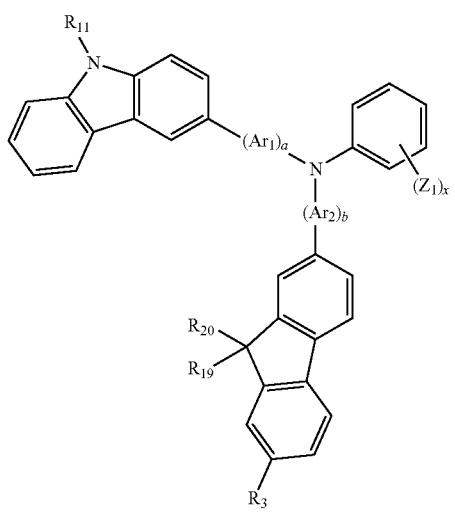

wherein, in Formulae 2A to 2K, $Ar_1$ and $Ar_2$ are each independently a substituted or unsubstituted $C_6$-$C_{30}$ arylene group;

a and b are each independently an integer from 0 to 5;

$R_{1a}$, $R_{1b}$, and $R_3$ are each independently a nitrogen atom-containing group;

$R_{11}$, $R_{19}$, and $R_{20}$ are each independently a substituted or unsubstituted $C_1$-$C_{30}$ alkyl group or a substituted or unsubstituted $C_6$-$C_{30}$ aryl group;

$Z_1$ to $Z_4$ are each independently a hydrogen atom, a deuterium atom, a halogen atom, a hydroxyl group, a cyano group, a nitro g group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_3$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, —Si$(Q_1)(Q_2)(Q_3)$, or —N$(Q_4)(Q_5)$, wherein, when x or y is at least two in number, a plurality of $Z_1$ or $Z_2$ are the same or different;

$Q_1$ to $Q_5$ are each independently a hydrogen atom, a deuterium atom, a halogen atom, a hydroxyl group, a cyano group, a nitro group, an amino group, an amidino group, hydrazine, hydrazone, a carboxyl group or a salt thereof, sulfonic acid or a salt thereof, phosphoric acid or a salt thereof, a substituted or unsubstituted $C_1$-$C_{30}$ alkyl group, a substituted or unsubstituted $C_2$-$C_{30}$ alkenyl group, a substituted or unsubstituted $C_2$-$C_{30}$ alkynyl group, a substituted or unsubstituted $C_1$-$C_{30}$ alkoxy group, a substituted or unsubstituted $C_3$-$C_{30}$ cycloalkyl group, a substituted or unsubstituted $C_6$-$C_{30}$ aryl group, a substituted or unsubstituted $C_6$-$C_{30}$ aryloxy group, a substituted or unsubstituted $C_6$-$C_{30}$ arylthio group, or a substituted or unsubstituted $C_2$-$C_{30}$ heteroaryl group;

x is an integer from 1 to 8; and y is an integer from 1 to 3.

5. The organic light-emitting device of claim 1, wherein the second hole transport compound and the fourth hole transport compound each independently include compound 2, 8, 14, 15, 16, 20, 31, or 35 below:

2

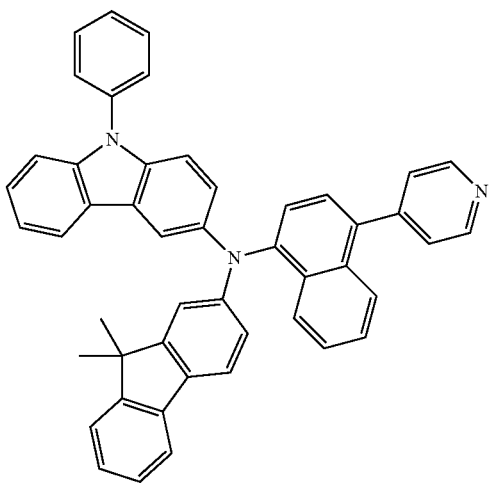

8

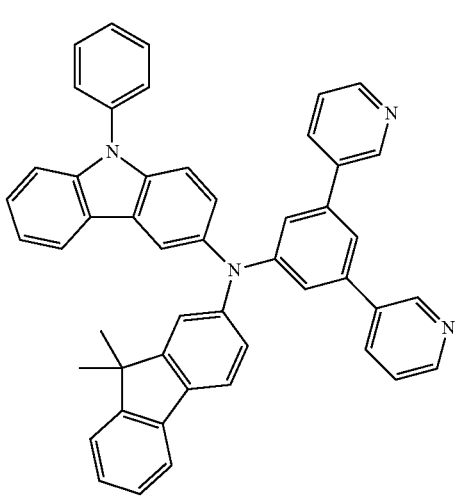

14
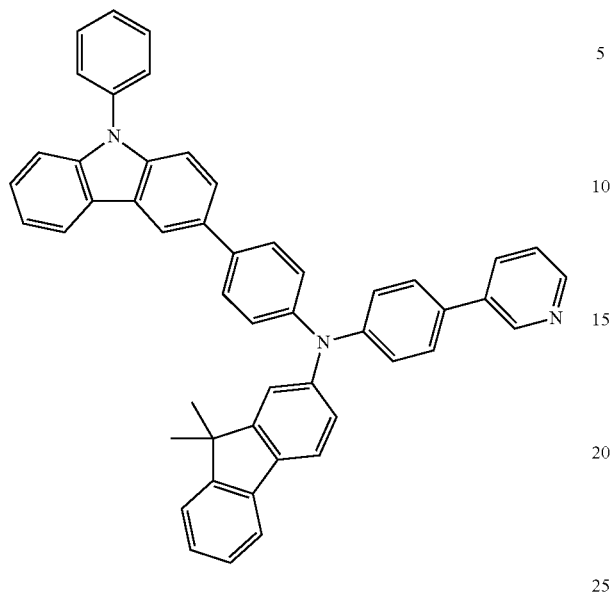
16
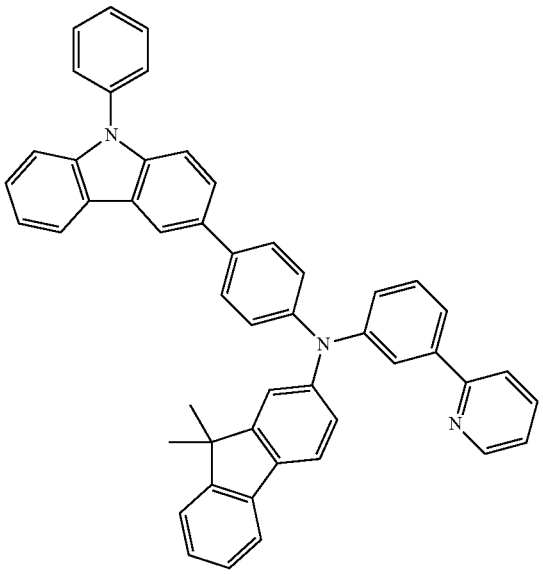
15
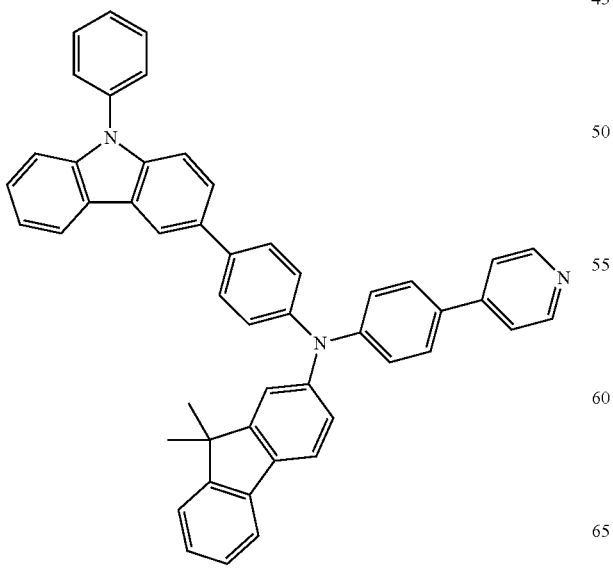
20

-continued

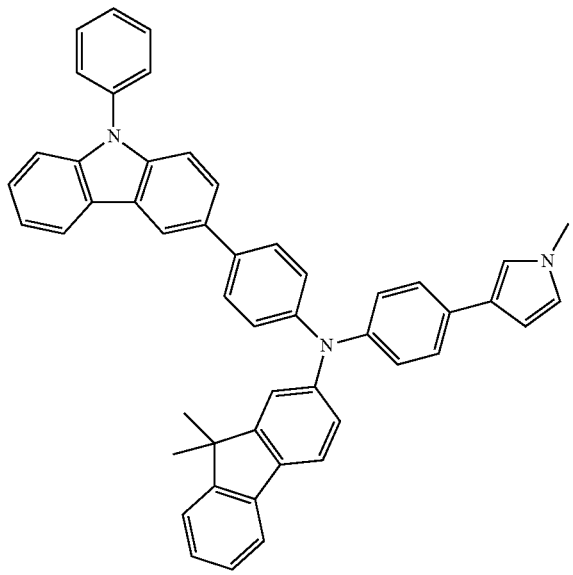

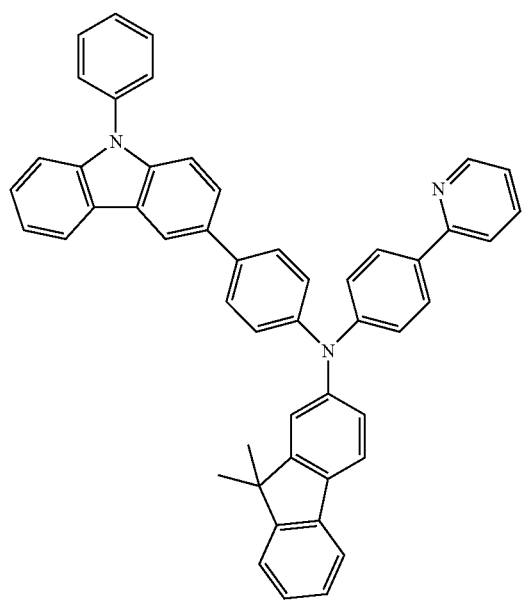

6. The organic light-emitting device of claim 1, wherein the first electron acceptor and the second electron acceptor each independently include compound 501 or 502 below:

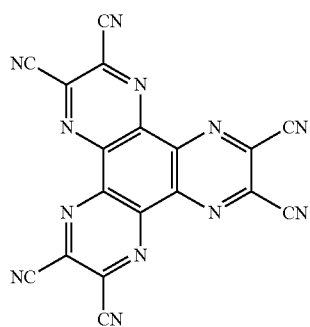

Compound 501

-continued

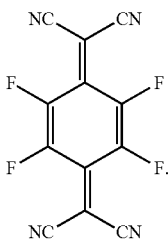

Compound 502

7. The organic light-emitting device of claim 1, wherein an amount of the first electron acceptor is from about 1 part to about 3 parts by weight based on 100 parts by weight of the first hole transport layer.

8. The organic light-emitting device of claim 1, wherein an amount of the second electron acceptor is from about 1 part to about 3 parts by weight based on 100 parts by weight of the third hole transport layer.

9. The organic light-emitting device of claim 1, wherein the first hole transport layer and the third hole transport layer are the same, and the second hole transport layer and the fourth hole transport layer are the same.

10. The organic light-emitting device of claim 9, wherein the first hole transport layer has a thickness of about 50 Å to about 400 Å, and the second hole transport layer has a thickness of about 200 Å to about 800 Å.

11. The organic light-emitting device of claim 1, wherein the buffer layer includes the first hole transport compound.

12. The organic light-emitting device of claim 1, wherein the buffer layer includes Compound 301 below:

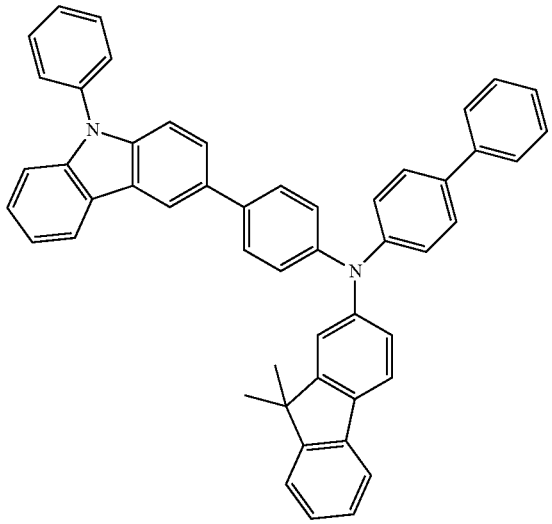

Compound 301

13. The organic light-emitting device of claim 1, wherein the buffer layer has a thickness of about 100 Å to about 1000 Å.

14. The organic light-emitting device of claim 1, wherein the pyrimidine-based compound is represented by Formula 3 below:

Formula 3

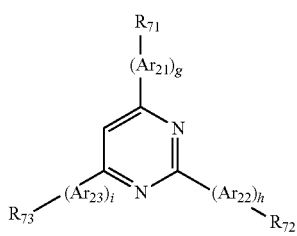

wherein, in Formula 3,

Ar$_{21}$, Ar$_{22}$, and Ar$_{23}$ are each independently a substituted or unsubstituted C$_6$-C$_{30}$ arylene group;

R$_{71}$, R$_{72}$, and R$_{73}$ are each independently a substituted or unsubstituted C$_2$-C$_{30}$ heteroaryl group; and g, h, and i are each independently an integer from 0 to 5.

15. The organic light-emitting device of claim 14, wherein the pyrimidine-based compound has a lowest unoccupied molecular orbital energy level of from about −2.4 eV to about −2.8 eV, and has a highest occupied molecular orbital energy level of from about −6.5 eV to about −6.0 eV.

16. The organic light-emitting device of claim 14, wherein the pyrimidine-based compound includes at least one of Compounds 701 to 704 below:

701

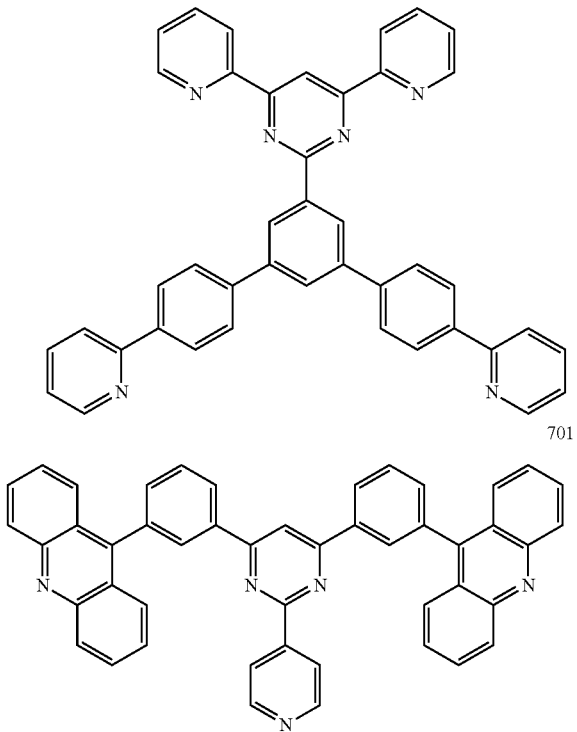

701

703

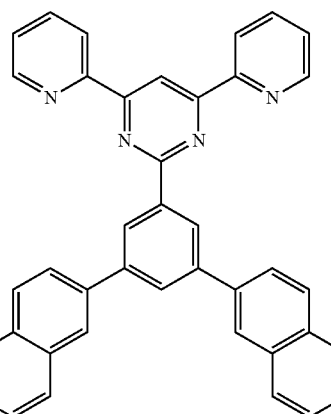

704

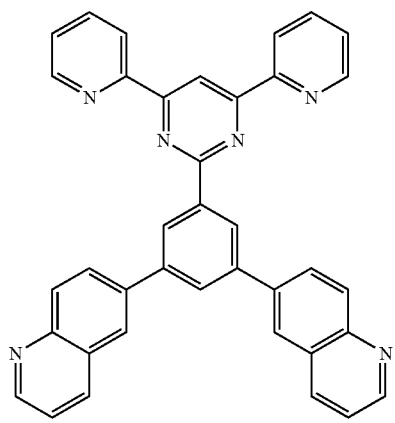

17. The organic light-emitting device of claim 1, wherein the first electrode and the first hole transport layer contact each other.

18. The organic light-emitting device of claim 1, further comprising an electron injection layer between the second electrode and the emission layer.

19. The organic light-emitting device of claim 18, wherein the electron injection layer includes at least one selected from lithium quinolate (LiQ), lithium fluoride (LiF), and Compound 101 below:

101

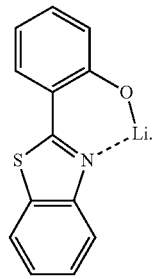

20. An organic light-emitting display device, comprising: a transistor including a source, a drain, a gate, and an active layer, and the organic light-emitting device of claim 1, the source or the drain being electrically connected to the first electrode of the organic light-emitting device.

* * * * *